(12) United States Patent
Pretl et al.

(10) Patent No.: US 11,323,070 B1
(45) Date of Patent: May 3, 2022

(54) OSCILLATOR WITH FIN FIELD-EFFECT TRANSISTOR (FINFET) RESONATOR

(71) Applicant: Apple Inc., Cupertino, CA (US)

(72) Inventors: Harald Pretl, Schwertberg (AU); Ehrentraud Hager, Linz (AU); Aly Ismail, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/233,137

(22) Filed: Apr. 16, 2021

(51) Int. Cl.
| | |
|---|---|
| *H03B 5/32* | (2006.01) |
| *H03B 5/04* | (2006.01) |
| *H01L 29/78* | (2006.01) |
| *H03B 5/12* | (2006.01) |

(52) U.S. Cl.
CPC ......... *H03B 5/326* (2013.01); *H01L 29/7851* (2013.01); *H03B 5/04* (2013.01); *H03B 5/1253* (2013.01); *H03B 5/323* (2013.01); *H01L 2924/13067* (2013.01)

(58) Field of Classification Search
CPC ......... H01L 21/823431; H01L 27/0886; H01L 29/66795; H01L 29/7831; H01L 29/785; H01L 29/7851; H01L 29/7858; H01L 2924/13067; H03B 5/04; H03B 5/323; H03B 5/326; H03H 3/0072; H03H 9/2405; H03H 2009/02314
See application file for complete search history.

(56) References Cited

U.S. PATENT DOCUMENTS

| | | | |
|---|---|---|---|
| 8,368,487 B1 * | 2/2013 | Sorenson | ................ H03H 9/17 333/187 |
| 9,294,035 B2 | 3/2016 | Manipatruni et al. | |
| 9,318,479 B2 | 4/2016 | Li et al. | |
| 9,391,073 B2 | 7/2016 | Yin et al. | |
| 9,577,060 B2 | 2/2017 | Kim et al. | |
| 9,663,346 B1 | 5/2017 | Bahr et al. | |
| 9,882,552 B2 | 1/2018 | Friend et al. | |
| 9,899,363 B1 * | 2/2018 | Bahr | ................ H01L 23/53214 |
| 9,922,979 B2 | 3/2018 | Chung et al. | |
| 10,153,277 B2 | 12/2018 | Tak et al. | |

(Continued)

OTHER PUBLICATIONS

Bahr et al., 32GHz Resonant-Fin Transistors in 14nm FinFET Technology, ISSCC 2018/ Session 21/ Extending Silicon and its Applications/ 21.3, 2018 IEEE International Solid-State Circuits Conference, Feb. 14, 2018, Digest of Technical Papers, pp. 348-350.

(Continued)

*Primary Examiner* — Levi Gannon
(74) *Attorney, Agent, or Firm* — Treyz Law Group, P.C.; Jason Tsai

(57) ABSTRACT

An integrated circuit may include oscillator circuitry having a resonator formed from fin field-effect transistor (FinFET) devices. The resonator may include drive cells of alternating polarities and sense cells interposed between the drive cells. The resonator may be connected in a feedback loop within the oscillator circuitry. The oscillator circuitry may include an amplifier having an input coupled to the sense cells and an output coupled to the drive cells. The oscillator circuitry may also include a separate inductor and capacitor based oscillator, where the resonator serves as a separate output filter stage for the inductor and capacitor based oscillator.

19 Claims, 17 Drawing Sheets

(56) References Cited

U.S. PATENT DOCUMENTS

| | | | |
|---|---|---|---|
| 10,409,307 | B2 | 9/2019 | Mengad et al. |
| 10,741,669 | B2 | 8/2020 | Leib et al. |
| 10,892,335 | B2 | 1/2021 | Ma et al. |
| 2010/0090302 | A1* | 4/2010 | Nguyen Hoang ... H03H 9/2405 257/428 |
| 2011/0024812 | A1* | 2/2011 | Weinstein ............ H03H 9/2452 257/296 |
| 2014/0292429 | A1* | 10/2014 | Manipatruni ............ H03B 5/30 331/108 C |
| 2016/0056252 | A1* | 2/2016 | Kim .................. H01L 29/42356 310/317 |
| 2019/0027576 | A1 | 1/2019 | Yang et al. |
| 2019/0140612 | A1* | 5/2019 | Elsayad .............. H03F 3/45475 |
| 2020/0161171 | A1 | 5/2020 | Colombeau et al. |
| 2020/0162024 | A1* | 5/2020 | Nikonov .................. H03B 5/24 |
| 2020/0212194 | A1* | 7/2020 | Gosavi ................ H01L 27/0886 |
| 2020/0342932 | A1 | 10/2020 | Bennett |
| 2020/0357899 | A1 | 11/2020 | Lo et al. |
| 2020/0366182 | A1 | 11/2020 | Bieber |
| 2020/0381536 | A1 | 12/2020 | Cheng |
| 2021/0013337 | A1 | 1/2021 | Chan et al. |
| 2021/0305245 | A1* | 9/2021 | Hudeczek ............ H03H 3/0077 |

OTHER PUBLICATIONS

Weinstein et al., Acoustic Resonance in an Independent-Gate FinFET, Solid-State Sensors, Actuators, and Microsystems Workshop, Hilton Head Island, South Carolina, Jun. 6-10, 2010, pp. 459-462.

Koo et al., A 2-GHz FBAR-Based Transformer Coupled Oscillator Design With Phase Noise Reduction, IEEE Transactions on Circuits and Systems-II: Express Briefs, vol. 66, No. 4, Apr. 2019 pp. 542-546.

Seong et al., A -58dBc-Worst-Fractional-Spur and -234dB-FoMjitter, 5.5GHz Ring-DCO-Based Fractional-N DPLL Using a Time-Invariant-Probability Modulator, Generating a Nonlinearity FTC-Control Word, ISSCC 2020/ Session 17/ Frequency Synthesizers & VCOs/ 17.3, 2020 IEEE International Solid-State Circuits Conference, Feb. 18, 2020, Digest of Technical Papers, pp. 270-272.

Jann et al., A 5G Sub-6GHz Zero-IF and mm-Wave IF Transceiver with MIMO and Carrier Aggregation, ISSCC 2019/ Session 21/ 4G/5G Transceivers/ 21.5, 2019 IEEE International Solid-State Circuits Conference, Feb. 20, 2019, Digest of Technical Papers, pp. 352-354.

Hu et al., A 1.5GHz 0.2psRMS Jitter 1.5mW Divider-less FBAR ADPLL in 65nm CMOS, IEEE, 2012.

Gao et al., A 2.7-to-4.3GHz, 0.16psrms-Jitter, -246.8dB-FOM, Digital Fractional-N Sampling PLL in 28nm CMOS, ISSCC 2016/ Session 9/ High-Performance Wireless/ 9.6/ 2016 IEEE International Solid-State Circuits Conference, Feb. 2, 2016, Digest of Technical Papers, pp. 174-176.

Temporiti et al., A 3.5 GHz Wideband ADPLL With Fractional Spur Suppression Through TDC Dithering and Feedforward Compensation, IEEE Journal of Solid-State Circuits, vol. 45, No. 12, Dec. 2010, pp. 2723-2736.

Wu et al., A 3.5-6.8-GHz Wide-Bandwidth DTC-Assisted Fractional-N All-Digital PLL With a MASH ΔΣ-TDC for Low In-Band Phase Noise, IEEE Journal of Solid-State Circuits, vol. 52, No. 7, Jul. 2017, pp. 1885-1903.

Mercandelli et al., A 12.5GHz Fractional-N Type-I Sampling PLL Achieving 58fs Integrated Jitter, ISSCC 2020/ Session 17/ Frequency Synthesizers & VCOs/ 17.5, 2020 IEE International Solid-State Circuits Conference, Feb. 18, 2020, pp. 274-276.

Tsai et al., A 12nm CMOS RF Transceiver Supporting 4G/5G UL MIMO, ISSCC 2020/ Session 10/ High-Performance Transceivers/ 10.3, IEEE International Solid-State Circuits Conference, Feb. 18, 2020, pp. 176-178.

Wu et al., A 28-nm 75-fsrms Analog Fractional-N Sampling PLL With a Highly Linear DTC Incorporating Background DTC Gain Calibration and Reference Clock Duty Cycle Correction, IEEE Journal of Solid-State Circuits, vol. 54, No. 5, May 2019, pp. 1254-1265.

He et al., A 40nm Dual-Band 3-Stream 802.11a/b/g/n/ac MIMO WLAN SoC with 1.1Gb/s Over-the-Air Throughput, ISSCC 2014/ Session 20/ Wireless Systems/ 20.5/ 2014 IEEE International Solid-State Circuits Conference, Feb. 12, 2014, pp. 350-352.

Seong et al., A -58dBc-Worst-Fractional-Spur and -234dB-FOMjitter, 5.5GHz Ring-DCO-Based Fractional-N DPLL Using a Time-Invariant-Probability Modulator, Generating a Nonlinearity-Robust DTC-Control Word, ISSCC 2020/ Session 17/ Frequency Synthesizer & VCOs/ 17.3, 2020 IEEE International Solid-State Circuits Conference, Feb. 18, 2020, pp. 270-272.

Santicciolio et al., A 66fsrms Jitter 12.8-to-15.2GHz Fractional-N Bang-Bang PLL with Digital Frequency-Error Recovery for Fast Locking, ISSCC 2020/ Session 17/ Frequency & Synthesizers & VCOs/17.2,2020 IEEE International Solid-State Circuits Conference, Feb. 18, 2020, pp. 268-270.

Lim et al., A 170MHz-Lock-In-Range and -253dB-FOMjitter, 12-ro-14.5GHz Subsampling PLL with a 150µW Frequency-Disturbance-Correcting Loop Using a Low-Power Unevenly Spaced Edge Generator, ISSCC 2020/ Session 17/ Frequency & Synthesizers & VCOs/ 17.8, 2020 IEEE International Solid-State Circuits Conference, Feb. 18, 2020, pp. 280-282.

Markulic et al., A DTC-Based Subsampling PLL Capable of Self-Calibrated Fractional Synthesis and Two-Point Modulation, IEEE Journal of Solid-State Circuits, vol. 51, No. 12, Dec. 2016, pp. 3078-3092.

Lee et al., A Low-Noise Wideband Digital Phase-Locked Loop Based on a Coarse-Fine Tim-to-Digital Converter With Subpicosecond Resolution, IEEE Journal of Solid State Circuits, vol. 44, No. 10, Oct. 2009, pp. 2808-2816.

Leeson, A Simple Model of Feedback Oscillator Noise Spectrum, Proceedings Letter, Proceedings on the IEEE, Feb. 1966, pp. 329-330.

Chee et al, A Sub-100µW 1.9-GHz CMOS Oscillator Using FBAR Resonator, 2005 IEEE Radio Frequency Integrated Circuits Symposium, pp. 123-126, Berkeley, CA 94704, USA.

Chen et al., A Sub-Sampling All-digital Fractional-N Frequency Synthesizer with -111dBc-Hz In-Band Phase Noise and an FOM of -242dB, ISSCC 2015/ Session 14/ Digital PLLS and SOC Building Blocks/ 14.9, 2015 IEEE International Solid-State Circuits Conference, Feb. 24, 2015, pp. 268-270.

Kamarudin et al., Design and Simulation Single stage CMOS TIA for 1.4 GHz,-27 dB MEMS SAW Resonator, 2017 IEEE Regional Symposium on Micro and Nanoelectronics (RSM).

Preyler et al., LO Generation With a Phase Interpolator Digital-to-Time Converter, IEEE Transactions on Microwave Theory and Techniques, vol. 65, No. 11, Nov. 2017, pp. 4669-4676.

Hudeczek et al., Polarization Independent Band Gaps in CMOS Back-End-of-Line for Monolithic High-Q MEMS Resonator Confinement, IEEE Transactions on Electron Devices, vol. 67, No. 11, Nov. 2020, pp. 4578-4581.

Bahr et al., Theory and Design of Phononic Crystals for Unreleased CMOS-MEMS Resonant Body Transistors, Journal of Microelectromechanical Systems, vol. 24, No. 5, Oct. 2015, pp. 1520-1533.

Bartsch et al., Very High Frequency Double-Ended Tuning Fork Nano-Mechanical Fin-FET Resonator, Lausanne, Switzerland.

Ionescu, Vibrating Body Transistors: Enabling Fin-FET Nano-Electro-Mechanical Resonators, p. 333, Lausanne, Switzerland, 2010.

Razavi et al., RF Microelectronics, Prentice Hall 1998, Chapter 8, Frequency Synthesizers, 1998, pp. 247-251.

* cited by examiner

OSCILLATOR WITH FIN FIELD-EFFECT TRANSISTOR (FINFET) RESONATOR

FIELD

Embodiments described herein relate generally to integrated circuits and, more particularly, to integrated circuits having oscillators with resonators formed from fin field-effect transistors (FinFETs).

BACKGROUND

Electronic devices often include wireless communications circuitry such as transceivers. Transceivers include oscillators, which are used to produce carrier waveforms for data modulation. State of the art transceivers require oscillators that can produce signals in the gigahertz frequency range.

Conventionally, high-frequency oscillators are implemented using off-chip crystal oscillators. Crystal oscillators generate signals in the megahertz frequency range, which are then multiplied to higher frequencies using phase-locked loops within a transceiver integrated circuit chip. Generating and distributing oscillator signals in this way consume a substantial amount of power.

SUMMARY

An acoustic wave resonator formed using fin field-effect transistors (FinFETs) or gate-all-around (GAA) FETs is provided. The resonator may be integrated onto a semiconductor chip. On-chip resonators can yield a high quality factor while minimizing phase noise, power consumption, and area overhead. The resonator may be formed as part of an oscillator or may be used as a filter stage at the output of an oscillator.

In accordance with some embodiments, an oscillator is provided that includes a resonator having drive terminals coupled to an oscillator output port, sense terminals coupled to the drive terminals via a feedback path, a substrate having a linear array of protruding fins characterized by a fin pitch that determines a resonant frequency of the resonator, and a gate conductor formed on the linear array of protruding fins. The gate conductor can be configured to extend in a direction perpendicular to each fin in the linear array of protruding fins, to form drive cells with respective groups of adjacent fins in the linear array of protruding fins such that the drive cells receive drive signals via the drive terminals to generate acoustic waves that travel along the linear array of protruding fins and that pulse at a frequency that is in a subharmonic frequency range of the resonant frequency, and to form sense cells with respective groups of adjacent fins in the linear array of protruding fins such that the sense cells are coupled to the sense terminals and are used to sense the acoustic waves. In other embodiments, the oscillator output port may instead be coupled at the sense terminals.

The oscillator can further include: a first resistor having a first terminal coupled to a first of the drive terminals and having a second terminal configured to receive a first bias voltage; a second resistor having a first terminal coupled to a second of the drive terminals and having a second terminal configured to receive the first bias voltage; a first transistor having a first source-drain terminal coupled to a first of the sense terminals, a second source-drain terminal coupled to the oscillator output port, and a gate terminal configured to receive a second bias voltage; a second transistor having a first source-drain terminal coupled to a second of the sense terminals, a second source-drain terminal coupled to the oscillator output port, and a gate terminal configured to receive the second bias voltage; a first capacitor having a first terminal coupled to the first of the drive terminals and having a second terminal coupled to the second source-drain terminal of the first transistor; a second capacitor having a first terminal coupled to the second of the drive terminals and having a second terminal coupled to the second source-drain terminal of the second transistor; a first load circuit having a first terminal coupled to the second source-drain terminal of the first transistor and having a second terminal coupled to a positive power supply line; and a second load circuit having a first terminal coupled to the second source-drain terminal of the second transistor and having a second terminal coupled to the positive power supply line.

In accordance with some embodiments, an oscillator is provided that includes: a resonator having drive terminals, sense terminals, and fin field-effect transistor (FinFET) circuitry coupled to the drive and sense terminals; and an amplifier having an input coupled to the sense terminals and having an output coupled to the drive terminals. The fin field-effect transistor (FinFET) circuitry can include a substrate having a linear array of protruding fins and a gate conductor formed on the linear array of protruding fins. The gate conductor can be configured to form drive cells with respective groups of adjacent fins in the linear array of protruding fins such that the drive cells receive drive signals from the drive terminals to generate acoustic waves that travel along the linear array of protruding fins and to form sense cells with respective groups of adjacent fins in the linear array of protruding fins such that the sense cells are coupled to the sense terminals and are used to sense the acoustic waves.

In accordance with some embodiments, oscillator circuitry is provided that includes: an oscillator having an inductor, a variable capacitor, and an oscillator output on which an oscillator signal is generated; and a resonator. The resonator can include drive terminals coupled to the oscillator output, sense terminals, and fin field-effect transistor (FinFET) circuitry coupled to the drive and sense terminals. The resonator can be configured to filter the oscillator signal. The fin field-effect transistor (FinFET) circuitry can include a substrate having a linear array of protruding fins and a gate conductor formed on the linear array of protruding fins. The gate conductor can be configured to form drive cells with respective groups of adjacent fins in the linear array of protruding fins such that the drive cells receive drive signals via the drive terminals to generate acoustic waves that travel along the linear array of protruding fins and to form sense cells with respective groups of adjacent fins in the linear array of protruding fins such that the sense cells are coupled to the sense terminals and are used to sense the acoustic waves. The oscillator circuitry can also include a level detector configured to monitor signals output from the sense terminals and to adjust the variable capacitor based on the monitored signals.

Further features of the invention, its nature and various advantages will be more apparent from the accompanying drawings and following detailed description.

DETAILED DESCRIPTION

This relates to a resonant device implemented using fin field-effect transistors (FinFETs). FinFETs may be formed on a substrate having a linear array of protruding fins and may include one or more gate conductors formed on the linear array of protruding fins. The resonant device may include alternating positive and negative drive cells and sense transistors interposed between the drive cells. The linear array of protruding fins may be characterized by a fin pitch that defines a resonant frequency for the resonant device and may be characterized by a fin width. In general, the resonant frequency is inversely related to the fin pitch (i.e., the resonant frequency is proportional to the reciprocal of the fin pitch). Each drive cell may include two or more drive fins separated by a fin-to-fin spacing that is equal to the fin pitch minus the fin width. Adjacent drive cells may be separated by a distance that is equal to the fin-spacing, five times the fin-to-fin spacing plus four times the fin width, seven times the fin-to-fin spacing plus six times the fin width, or may have other suitable spacing schemes. The region between adjacent drive cells can include fully formed fins, partially formed fins, or may be completely devoid of fins.

The resonant frequency of a FinFET-based resonant device can be in the gigahertz frequency range (e.g., greater than 50 GHz). The drive cells may be configured to receive a differential drive signal having a drive frequency that is a fraction of, greater than, or equal to the characteristic resonant frequency. Configured in this way, the resonant device can provide a high quality factor (e.g., a quality factor Q of more than 10,000) while incurring minimal phase noise. Unlike a conventional crystal oscillator, a FinFET based resonant device can be integrated on-chip as part of an integrated circuit die on which other components that utilize the high frequency output of the resonant device are formed. A monolithic integration of the resonant device in this way can help substantially reduce circuit area and power consumption. Such FinFET based resonator can be formed as part of an oscillator circuit. Resonators formed from FinFET circuitry that is excited using a drive voltage signal and sensed using a sense current signal that is converted back into the voltage domain via a feedback path is sometimes referred to as an active FinFET resonator device with a feedback loop.

Figure 1:
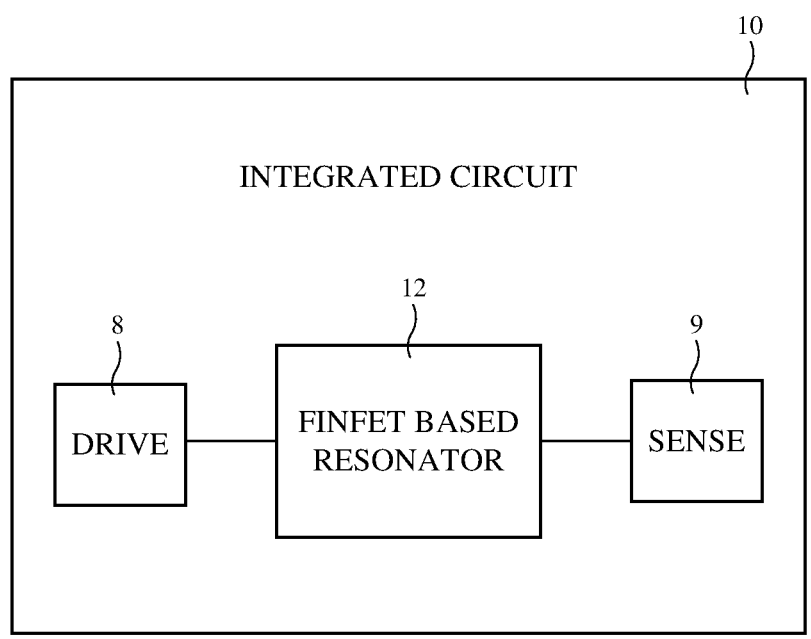
FIG. 1 is a diagram of an illustrative integrated circuit that includes a fin field-effect transistor (FinFET) based resonator in accordance with some embodiments.

FIG. 1 is a diagram of an illustrative integrated circuit such as integrated circuit 10 having a resonator such as resonator circuit 12. Integrated circuit 10 can be wireless communications processor such as a radio-frequency transceiver chip (as an example). This is merely illustrative. Integrated circuit 10 may generally represent any processing device that might utilize a periodic signal in the gigahertz (GHz) frequency range. Resonator 12 may be implemented using FinFET devices and may therefore sometimes be referred to as a FinFET based resonator. As shown in FIG. 1, FinFET based resonator 12 may include an input port configured to receive drive signals from a drive circuit 8 and may also include an output port coupled to a corresponding sense circuit 9. In response to receiving the drive signals at the input port, resonator 12 can generate corresponding resonator output signals (sometimes referred to as an oscillator output signal) that are fed to sense circuit 9 via the output port.

FinFET based resonator 12 that is integrated within chip 10 can be used to achieve a high resonant frequency that is not otherwise attainable using a conventional off-chip crystal oscillator. Conventional crystal oscillators typically exhibit resonant frequencies less than 100 MHz. Other external resonators such as surface-acoustic-wave (SAW) resonators, bulk-acoustic-wave (BAW) resonators, and thin-film bulk-acoustic resonators can exhibit resonant frequencies in the gigahertz range but cannot be integrated onto an integrated circuit die. Resonator 12 can also exhibit a high Q factor. The Q (or quality) factor refers to a dimensionless parameter indicative of the degree to which a resonator is underdamped, which is defined as the ratio of the initial energy stored in the resonator to the energy lost in one cycle of oscillation. A low Q factor represents a higher degree of damping, which signifies higher energy loss. A high Q factor represents a lower degree of damping, which signifies lower energy loss. FinFET based resonator 12 can exhibit a Q factor that is greater than a thousand, greater than ten thousand, greater than twenty thousand, greater than thirty thousand, greater than forty thousand, ten to fifty thousand, more than fifty thousand, fifty to a hundred thousand, or more than a hundred thousand. FinFET based resonator 12 is capable of achieving such high Q factor values while minimizing phase noise.

Figure 2A:
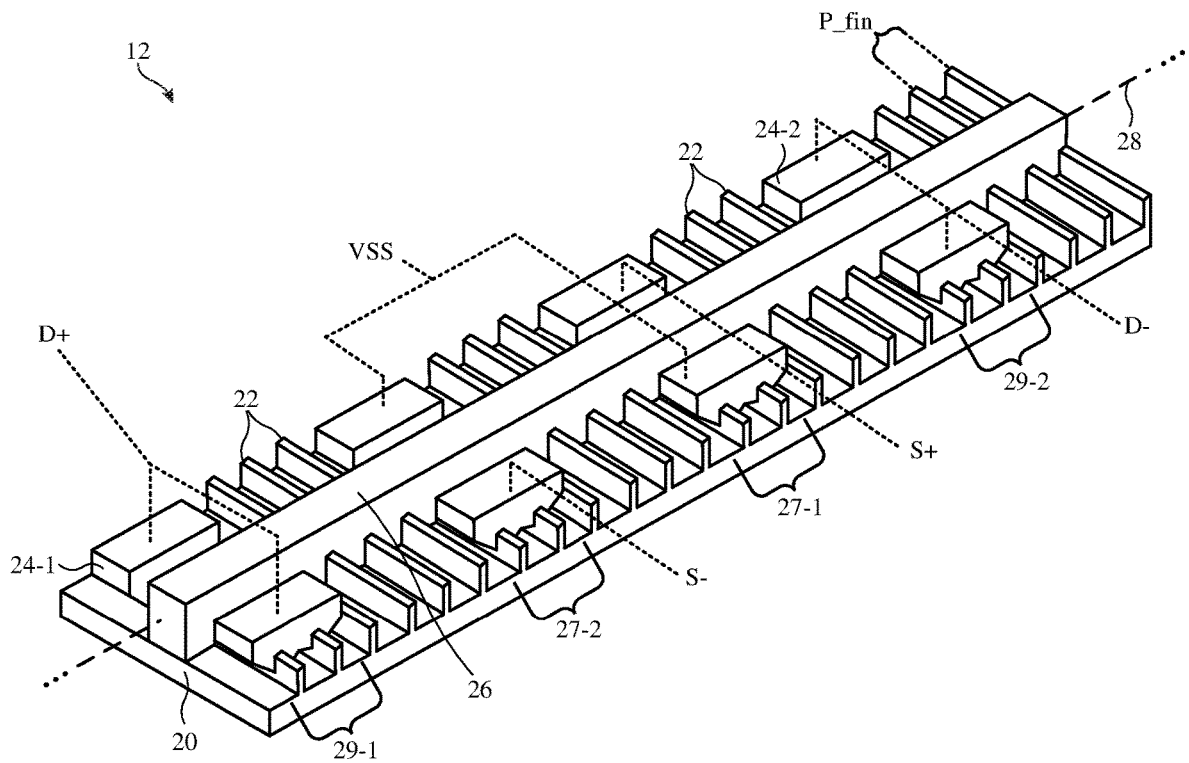
FIG. 2A is a perspective view of an illustrative FinFET-based resonator in accordance with some embodiments.

FIG. 2A is a perspective view of FinFET-based resonator 12 in accordance with some embodiments. As shown in FIG. 2A, resonator 12 may be formed on a substrate such as semiconductor substrate 20 (e.g., a p-type substrate or an n-type substrate). Substrate 20 may be patterned to form a linear array (rows) of fins 22 each of which are parallel to one another. The linear array of fins includes fins extending along a linear axis such as axis 28. Fins 22 (sometimes referred to as fin members or fin-shaped members) are integral with substrate 20 and protrude from a surface of substrate 20.

A gate conductor such as gate conductor 26 may be formed over the array of fins 22. Gate conductor 26 may extend along a longitudinal axis 28 that is perpendicular to each fin in the array of fins 22. Gate conductor 26 may be formed from polysilicon, titanium, tungsten, tantalum, molybdenum, aluminum, nickel, chromium, copper, silver, gold, a combination of these materials, other metals, replacement metal gate (RMG) material, or other suitable conductive gate material.

A layer of dielectric material may be formed between gate conductor 26 and each of fins 22. This layer of dielectric material under gate 26 is sometimes referred to as a gate insulating layer and can be formed using silicon oxide, silicon nitride, silicon oxynitride, tantalum oxide, cerium oxide, carbon-doped oxide, aluminum oxide, hafnium oxide, titanium oxide, zirconium oxide, vanadium oxide, tungsten oxide, lithium oxide, strontium oxide, yttrium oxide, barium oxide, molybdenum oxide, a combination of these materials, and other suitable high-k (e.g., materials with a dielectric constant greater than that of silicon dioxide) or low-k (e.g., materials with a dielectric constant lower than that of silicon dioxide) dielectric material.

Gate conductor 26 wraps around a portion of each protruding fin 22. The portion of fin 22 that is covered by gate conductor 26 may serve as a channel region for a FinFET (sometimes referred to and/or defined as a fin transistor, a non-planar transistor, or a multi-gate transistor). The portions of each fin 22 on either side of gate conductor 26 may serve as a source region or a drain region for the fin transistor. The terms "source" and "drain" terminals that are used to describe current-conducting terminals of a transistor are sometimes interchangeable and may sometimes be referred to herein as "source-drain" terminals. Regions in substrate 20 that are not source-drain or channel regions may be at least partially filled by a layer of dielectric material configured to provide electrical isolation between adjacent fin transistors.

In FIG. 2A, pairs of fin transistors may be coupled together to form drive cells. For instance, a first pair of transistors may have source-drain fin members coupled to a positive drive terminal D+ via source-drain contact structures 24-1 to serve as a positive drive cell 29-1. A second pair of transistors may have source-drain fin members coupled to a negative drive terminal D− via source-drain contact structures 24-2 to serve as a negative drive cell 29-2. FinFETs that are part of a drive cell may sometimes be referred to and/or defined as drive transistors. In FIG. 2A, there are at least two drive transistors within each positive or negative drive cell. Source-drain contact structures such as structures 24-1 and 24-2 may be epitaxial silicon material formed via epitaxial growth (as an example). If desired, other types of source-drain or ohmic contact structures can be used.

Additional drive cells can be formed in the vicinity of positive drive cell 29-1. In FIG. 2A, an additional negative drive cell (i.e., another drive cell driven by the D− drive terminal) sharing the same gate conductor 26 can be formed to the left of positive drive cell 29-1. Additional drive cells of alternating polarity may be formed along gate conductor 26 to the left of the additional negative drive cell. Similarly, an additional positive drive cell (i.e., another drive cell driven by the D+ drive terminal) sharing the same gate conductor 26 can be formed to the right of negative drive cell 29-2. Additional drive cells of alternating polarity may be formed along gate conductor 26 to the right of the additional positive drive cell.

Pairs of fin transistors may be coupled together to form sense cells. For instance, a first pair of fin transistors may have source fin members coupled to a ground terminal VSS via a corresponding source contact and have drain fin members coupled to a positive sense terminal S+ via a corresponding drain contact to serve as a positive sense cell 27-1. A second pair of fin transistors may have source fin members coupled to ground terminal VSS via a corresponding source contact and have drain fin members coupled to a negative sense terminal S− via a corresponding drain contact to serve as a negative sense cell 27-2. FinFETs that are part of a sense cell may sometimes be referred to and/or defined as sense transistors. In FIG. 2A, there are at least two sense transistors within each positive or negative sense cell.

In the example of FIG. 2A, each drive cell and each sense cell include only two adjacent fin transistors. Adjacent drive cells may be separated by a four-fin spacing (e.g., four undriven, floating, or otherwise inactive fins 22 occupy the region between adjacent positive and negative drive cells). Adjacent sense cells may also be separated by a four-fin spacing (e.g., four undriven or floating fins 22 occupy the region between adjacent positive and negative sense cells). Adjacent drive and sense cells may also be separated by a four-fin spacing (e.g., four undriven or floating fins 22 occupy the region between drive cell 24-1 and sense cell 27-2). This arrangement where each drive/sense cell includes only two adjacent transistors and where adjacent drive/sense cells are separated by a four-fin spacing is sometimes referred to here as a "connect-2-skip-4" configuration.

Configured in this way, gate conductor 26 and the channel region of the various drive cells collectively form a gate capacitor structure. Gate conductor 26 may be biased to a fixed DC voltage. The fixed DC voltage may be equal to the power supply voltage that powers integrated circuit 10 (FIG. 1) or may be some reference voltage level that is greater than or less than the power supply voltage. For example, gate conductor 26 may be biased to 0.7, 0.8 V, 0.9 V, 1 V, greater than 1 V, less than 0.8 V, 0.5-1 V, or other suitable DC voltage level. The D+/D− drive terminals may collectively receive a differential drive signal (e.g., a differential sine wave) from drive circuit 8 such that the signal components at the D+ and D− terminals are in-phase with one another. In accordance with some embodiments, the drive signal may have a drive frequency that is in a subharmonic frequency range of the resonant frequency of resonator 12 (e.g., the drive signal may be excited at a drive frequency that is equal to half of the resonant frequency, a third of the resonant frequency, a fourth of the resonant frequency, or some other fraction of the resonant frequency).

When drive circuit 8 applies the drive signals to the drive transistors, a voltage difference between gate conductor 26 and the respective source-drain fin regions causes a change in the stored energy in the gate capacitor structure, which induces an electrostatic force that generates mechanical stress (e.g., a stress that effectively squeezes the fin channel portions). This generates a periodic acoustic wave that pulses back and forth along the linear array of fins via gate conductor 26. As shown in FIG. 2A, the sense transistors can be interposed between the drive cells to detect such mechanical vibration along gate conductor 26. This is sometimes referred to as an active sensing scheme in which the acoustic waves travelling along gate 26 will generate a corresponding change in current flowing through the sense transistors. The sense transistors may be coupled to sense circuit 9 (FIG. 1) and may be biased in the linear region, saturation region, subthreshold region, or other transistor operating regimes.

Figure 2B:
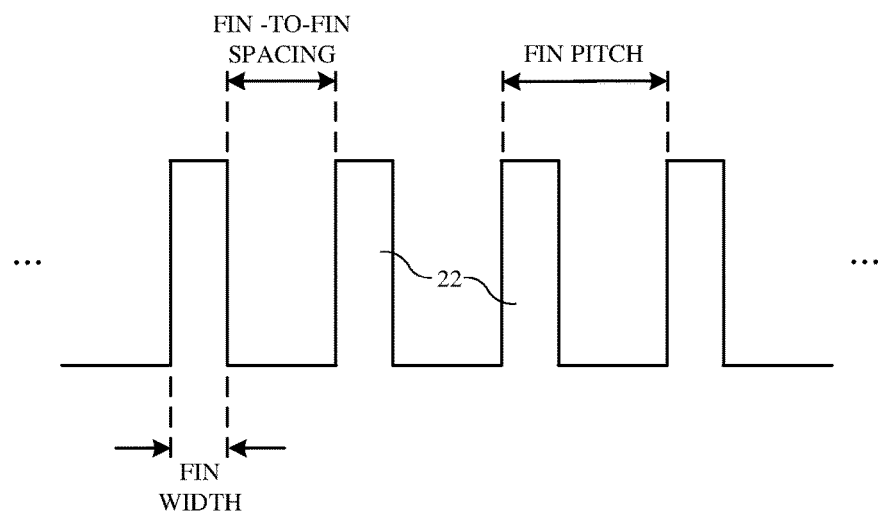
FIG. 2B is a cross-sectional side view of a linear array of fins illustrating fin width, fin-to-fin spacing, and fin pitch in accordance with some embodiments.

The linear array of fins 22 is characterized by a fin pitch P_fin and a fin width (see, e.g., FIG. 2B). As shown in FIG. 2B, each fin 22 has a fin width, and the closest edges of two adjacent fins 22 are separated by a distance referred to herein as a fin-to-fin spacing. Fin pitch P_fin is defined as being equal to the fin-to-fin spacing plus the fin width. Referring back to FIG. 2A, the fins within each drive and sense cells have a fin-to-fin spacing that is equal to the fin pitch minus the fin width. The intervening region between adjacent cells may be separated by a distance that is equal to four times the fin width plus five times the fin-to-fin spacing, which is equal to four times the fin pitch plus one fin-to-fin spacing. The intervening region may extend a distance that is, in general, equal to 2n (i.e., 2*n) times the fin pitch plus one fin-to-fin spacing, where n is equal to the number of adjacent fins in each drive or sense cell.

Figure 3:
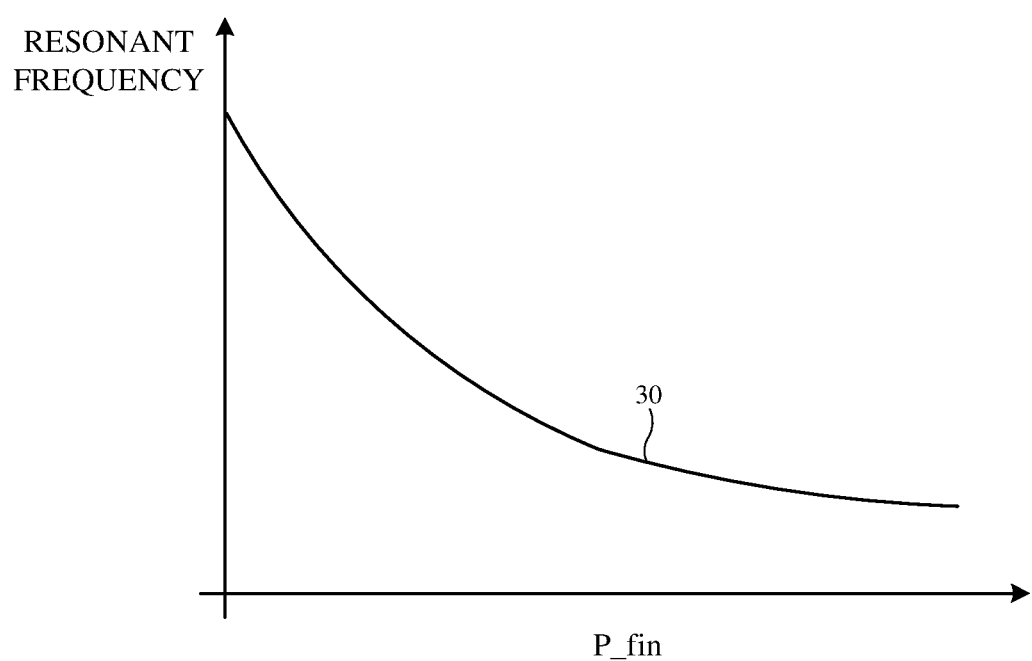
FIG. 3 is a plot showing how resonant frequency varies as a function of fin pitch in accordance with some embodiments.

Resonator 12 may exhibit a characteristic resonant frequency that is set by specific fin dimensions and the fin pitch of the linear array of protruding fins 22. FIG. 3 is a plot showing how the resonant frequency of resonator 12 varies as a function of fin pitch P_fin. As shown by curve 30 in FIG. 3, the resonant frequency increases as the fin pitch decreases. As state of the art integrated circuit manufacturing processes continue to advance to smaller technology nodes, the fin pitch becomes so small that pushes the resonant frequency to extremely high frequencies (e.g., resonant frequencies of 50-100 GHz or more). It can be challenging to design radio-frequency oscillators, filters, and other peripheral circuits that operate at such high frequencies.

Figure 4A:
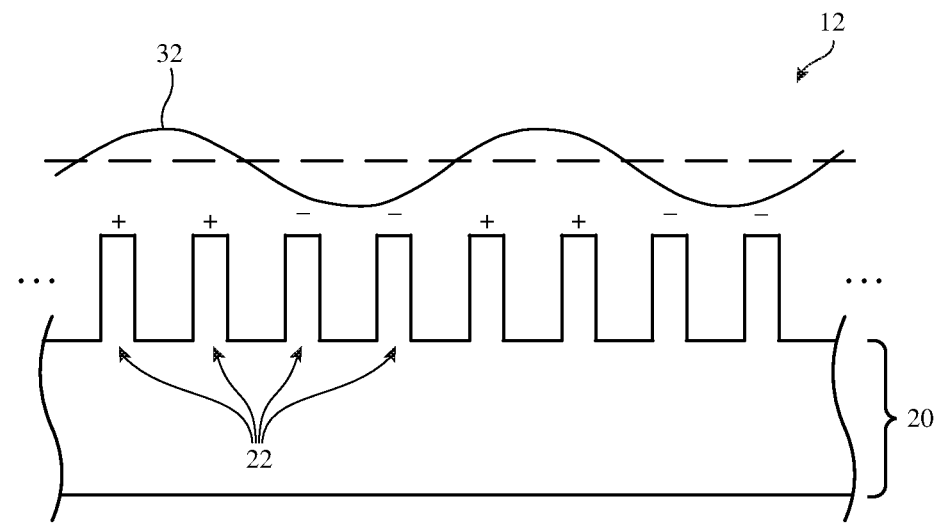
FIGS. 4A and 4B are cross-sectional side views illustrating a "++--++--" stress pattern along a linear array of fins in accordance with some embodiments.
Figure 4B:
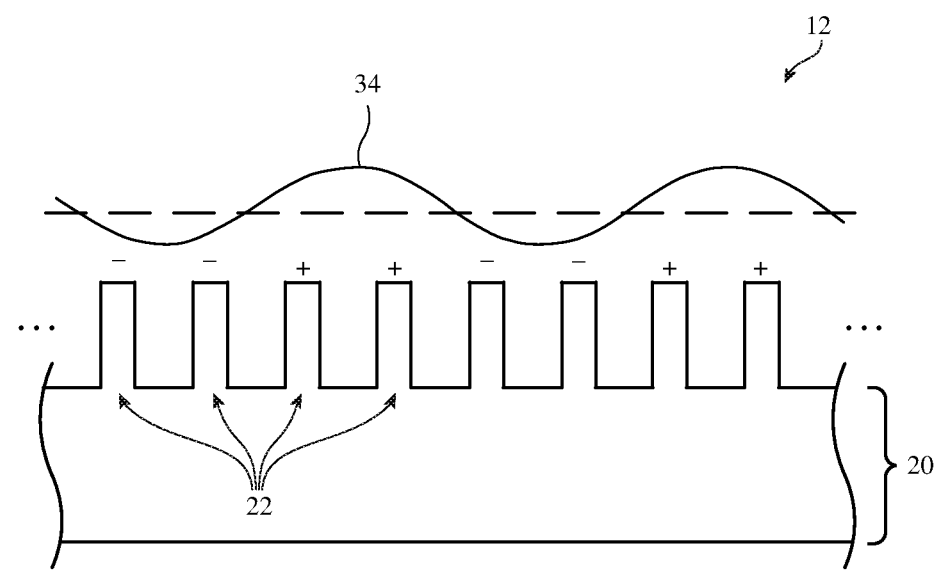

To help ameliorate these design challenges, resonator 12 may be configured and operated in a way so that it produces an acoustic wave that oscillates at a frequency that is in a subharmonic frequency range of the resonator's characteristic resonant frequency. The exemplary connect-2-skip-4 configuration of FIG. 2A can be used to attain a subharmonic resonance mode. FIGS. 4A and 4B are cross-sectional side views showing how pressure (e.g., a volume pressure within the resonant cavity) changes over time across fins 22 of resonator 12 with the connect-2-skip-4 configuration.

As shown by pressure profile 32 in FIG. 4A, pairs of adjacent fins 22 experience alternating polarities of stress caused by the acoustic waves generated by the drive signals applied to the driving fins. Fins 22 subject to positive pressure may be pushed or squeezed along the fin width, whereas fins 22 subject to negative pressure may be pulled or stretched along the fin width. As a result, fins 22 within resonator 12 will have a corresponding "++−−++−−" stress pattern. FIG. 4B shows pressure profile 34 half a cycle later when the stress inverts. Such stress pattern can yield a subharmonic resonance mode oscillating at half the characteristic frequency (as an example). For example, even when the fin pitch sets a resonant frequency of 52 GHz, resonator 12 having a connect-2-skip-4 configuration is operable at a subharmonic resonant frequency of 26 GHz.

This example in which the operating frequency is half of the resonant frequency is merely illustrative. As other examples, resonator 12 may be configured to operate at a third of the resonant frequency, a fourth of the resonant frequency, a fifth of the resonant frequency, a sixth of the resonant frequency, a seventh of the resonant frequency, an eighth of the resonant frequency, ⅔ of the resonant frequency, ¾ of the resonant frequency, ⅖ of the resonant frequency, or at any suitable subharmonic or fraction of the resonant frequency. Operating resonator 12 at a frequency that is less than the characteristic resonant frequency can help simplify the design of circuits that receive signals from or otherwise operate in conjunction with resonator 12.

Examples in which resonator 12 is operated at a frequency that is in a subharmonic frequency range of the resonant frequency is merely illustrative. In other embodiments, resonator 12 may be operated in a harmonic frequency range of the resonant frequency (e.g., resonator 12 may operate at a frequency that is 2× the resonant frequency, 3× the resonant frequency, 4× the resonant frequency, 2-10× the resonant frequency, etc.) or at a frequency that is greater than the resonant frequency. If desired, resonator 12 may also operate at the characteristic resonant frequency.

Figure 5:
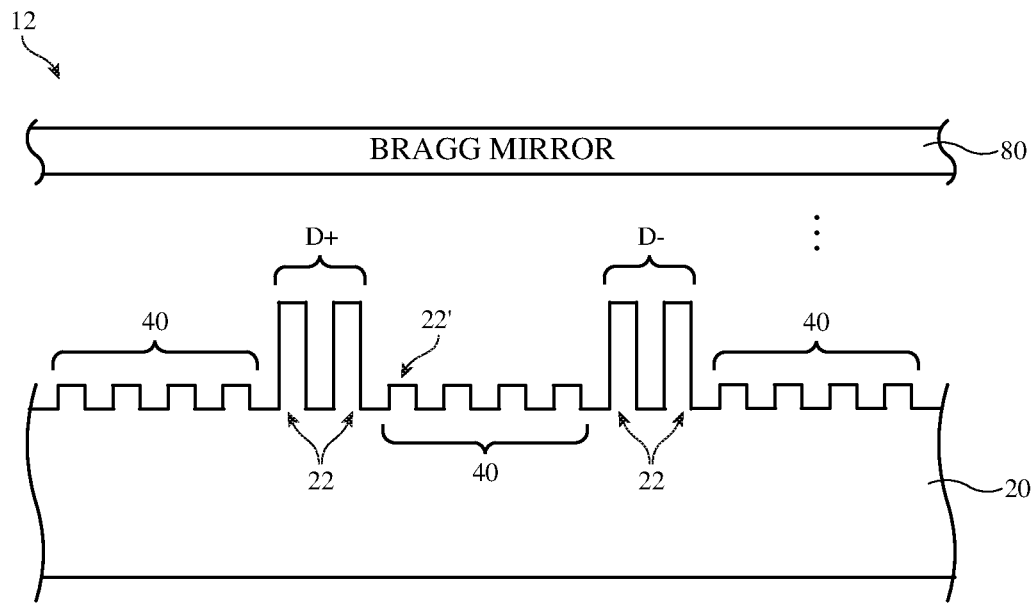
FIG. 5 is a cross-sectional side view of an illustrative FinFET-based resonator having pairs of driving fins separated by an intervening region that accommodates four fins in accordance with some embodiments.

The embodiment of FIG. 2A in which the regions separating adjacent drive and sense cells include fully formed fins 22 are merely illustrative. FIG. 5 shows another suitable embodiment of resonator 12 in which adjacent drive cells are separated by regions having partially formed fins. As shown in FIG. 5, a positive drive cell (denoted by a pair of fins coupled to terminal D+) and a negative drive cell (denoted by a pair of fins coupled to terminal D−) may be separated by a region 40 having partially formed fins 22'. In comparison to the fully formed fins 22, partially formed fins 22' may be shorter in height. For example, partially formed fins 22' may exhibit a reduced height that is less than 50% of the height of fins 22, less than 40% of the height of fins 22, less than 30% of the height of fins 22, less than 20% of the height of fins 22, less than 10% of the height of fins 22, less than 5% of the height of fins 22, 10-50% of the height of fins 22, or other suitable fraction of the height of fins 22. Additional drive cells of alternating polarity be formed to the left of the positive drive cell and to the right of the negative drive cell as shown in the cross section of FIG. 5.

The acoustic energy generated by the drive cells should be confined within resonator 12 to maximize the Q factor while minimizing energy loss. The acoustic energy should be confined in all directions within the resonant cavity of resonator 12. Vertical confinement can be achieved using the bulk substrate 20 as the lower confinement boundary and using metal layers in a dielectric stack formed over the FinFETs as the upper confinement boundary. The dielectric stack (sometimes referred to as interconnect stack) may include alternating metal routing layers and via layers. Multiple metal layers in the dielectric stack can be used to form a reflector layer such as Bragg mirror 80 that is configured to reflect acoustic waves back towards substrate 20. As another example, one or more metal layers in the dielectric stack can be used to form a phononic crystal layer to serve as the top vertical confinement boundary for the resonant cavity. Adding a Bragg mirror, a phononic crystal layer, or other acoustic wave reflecting layer over the linear array of fins can help increase the Q factor of resonator 12. In general, resonator 12 of the type described in connection with FIGS. 1-12 can all include an upper reflector layer 80 to help ensure adequate vertical confinement.

Figure 6:
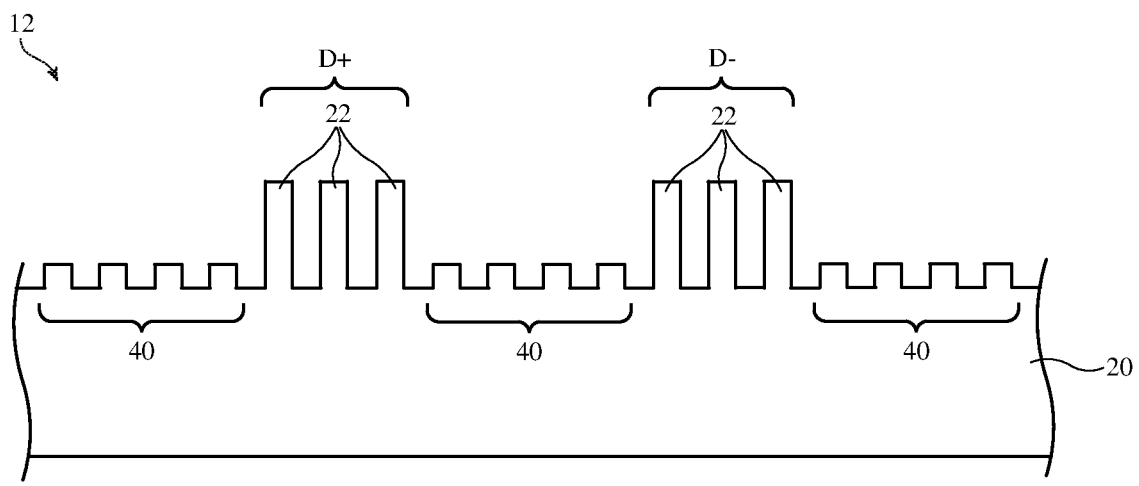
FIG. 6 is a cross-sectional side view of an illustrative FinFET-based resonator having groups of three driving fins separated by an intervening region that accommodates four fins in accordance with some embodiments.

The example of FIG. 5 showing a connect-2-skip-4 configuration with partially formed fins in the intervening regions 40 is merely illustrative. FIG. 6 shows another embodiment having a connect-3-skip-4 configuration with partially formed fins in the intervening regions 40. As shown in FIG. 6, a positive drive cell (denoted by three adjacent fins coupled to terminal D+) and a negative drive cell (denoted by three adjacent fins coupled to terminal D−) may be separated by a region 40 having partially formed fins 22' (e.g., fins that are shorter in height than the fully formed fins 22). Additional drive cells of alternating polarity be formed to the left of the positive drive cell and to the right of the negative drive cell as shown in the cross section of FIG. 6. The sense cells within resonator 12 of FIG. 6 are also separated by an intervening region that can accommodate four fins (e.g., the intervening region spans a distance equal to four times the fin width plus five times the fin-to-fin spacing). The example of FIG. 6 in which partially formed fins 22' are interposed between adjacent drive cells is merely illustrative. In yet other suitable embodiments, the regions separating adjacent drive and sense cells may not include any protruding fin structures (e.g., region 40 may not include any fins but can still effectively maintain a distance that would otherwise accommodate four fins).

The examples of FIGS. 2A and 5 showing resonator 12 having a connect-2-skip-4 configuration that is operable at subharmonic resonance is merely illustrative. Design rules permitting, a resonator 12 having a connect-1-skip-m configuration can also be implemented. Integer m can be equal to 1, 2, 3, 4, 5, 6, 7, 8, 1-12, greater than 12, or zero. In a connect-1-skip-m configuration, each drive cell includes only one drive transistor (e.g., the source-drain fin of a drive transistor can be individually connected to a D+ or D− terminal) while adjacent drive and sense cells are separated by an intervening region that can accommodate up to m fins. In other embodiments, a resonator 12 having a connect-k-skip-m configuration can also be implemented, where k can be equal to 2, 4, 6, 8, or other even integer values.

Figure 7A:
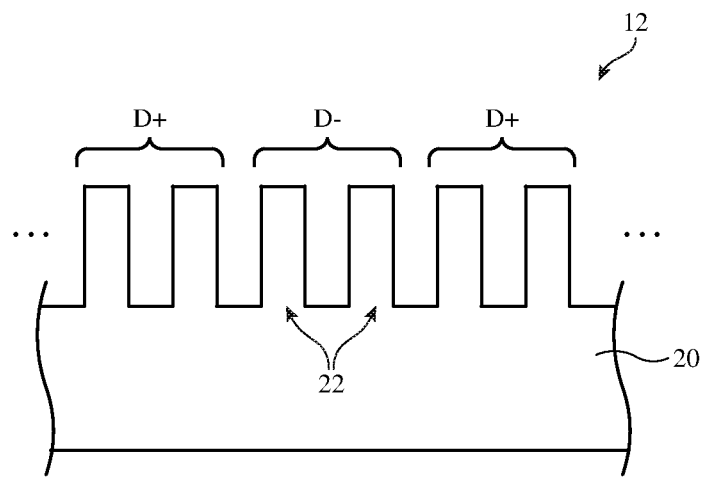
FIGS. 7A and 7B are cross-sectional side views of an illustrative FinFET-based resonator having driving cells of alternating polarity, each of which includes a pair of fins in accordance with some embodiments.

The examples above in which adjacent drive and sense cells are separated by an intervening region with nondriven, floating, or otherwise inactive fins are merely illustrative. FIG. 7A shows another embodiment in which alternating drive cells are immediately adjacent to one another. As shown in FIG. 7A, a negative drive cell denoted by a pair of fins coupled to terminal D− include the only fins separating the surrounding positive drive cells, each of which includes a pair of fins coupled to terminal D+. In other words, the spacing between the positive and negative drive cells is equal to one fin-to-fin spacing, which is equal to one fin pitch minus a fin width. This configuration can be used to achieve the "++−−++−−" stress pattern shown in FIGS. 4A and 4B, thereby achieving subharmonic resonance operation.

Figure 7B:
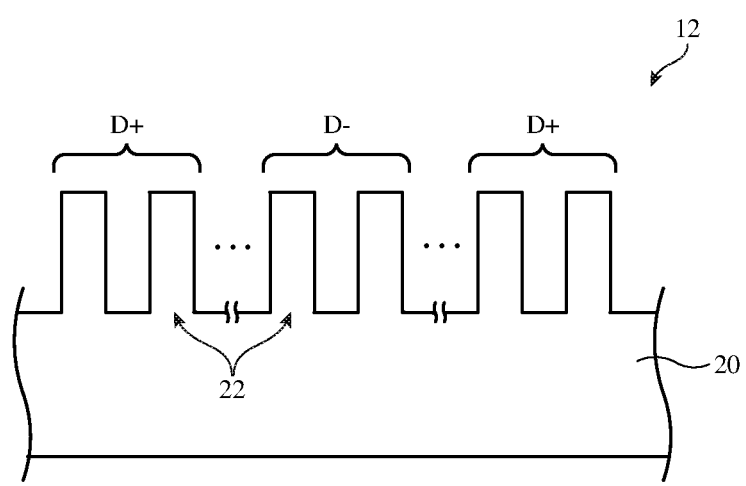

The example of FIG. 7A in which resonator 12 includes adjacent alternating drive cells separated by one fin-to-fin spacing is merely illustrative. FIG. 7B shows another embodiment in which adjacent drive cells are separated by an intervening region that is longer than one fin-to-fin spacing. As shown in FIG. 7B, the region between adjacent alternating drive cells can in general accommodate one or more intervening fins, two or more intervening fins, three or more intervening fins, four or more intervening fins, or other suitable number of intervening fins. Such intervening regions might include fully formed fins, partially formed fins, or no fins. The sense cells within resonator 12 of FIG. 7B can also be separated by an intervening region that can accommodate the same number of fins that separate adjacent drive cells.

Figure 8A:
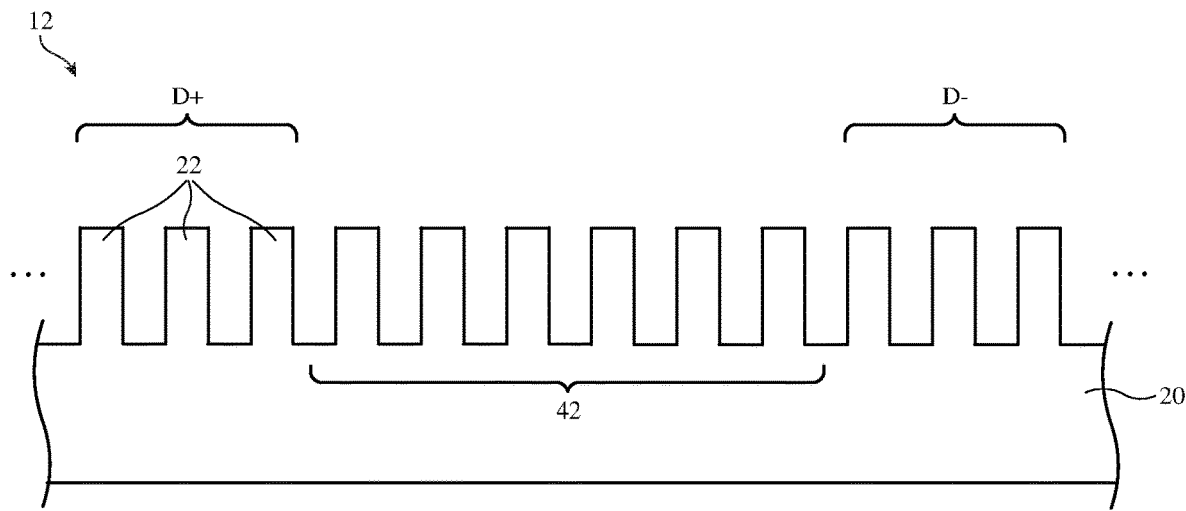
FIG. 8A is a cross-sectional side view of an illustrative FinFET-based resonator having groups of three driving fins separated by an intervening region that accommodates six fins in accordance with some embodiments.

The examples of resonator 12 shown in at least FIGS. 2A, 5, 7A, and 7B can be used to achieve the "++−−++−−" shown in FIGS. 4A and 4B. FIG. 8A shows another embodiment that can be used to achieve a "+++−−−+++−−−" stress pattern. In particular, FIG. 8A illustrates a connect-3-skip-6 configuration, which includes a positive drive cell (denoted by a triplet of fins coupled to terminal D+) and a negative drive cell (denoted by a triplet of fins coupled to terminal D−) that are separated by an intervening region 42. Intervening region 42 may extend a distance that is equal to six times the fin width plus seven times the regular fin-to-fin spacing, which is equal to six times the fin pitch plus one fin-to-fin spacing. Intervening region 42 might include fully formed fins (as shown), partially formed fins, or no fins. Additional drive cells of alternating polarity be formed to the left of the positive drive cell and to the right of the negative drive cell as shown in the cross section of FIG. 8A. The sense cells within resonator 12 of FIG. 8A can also be separated by an intervening region that can accommodate six fins (e.g., the intervening region may span a distance equal to six times the fin width plus seven times the (in-to-fin spacing).

Figure 9A:
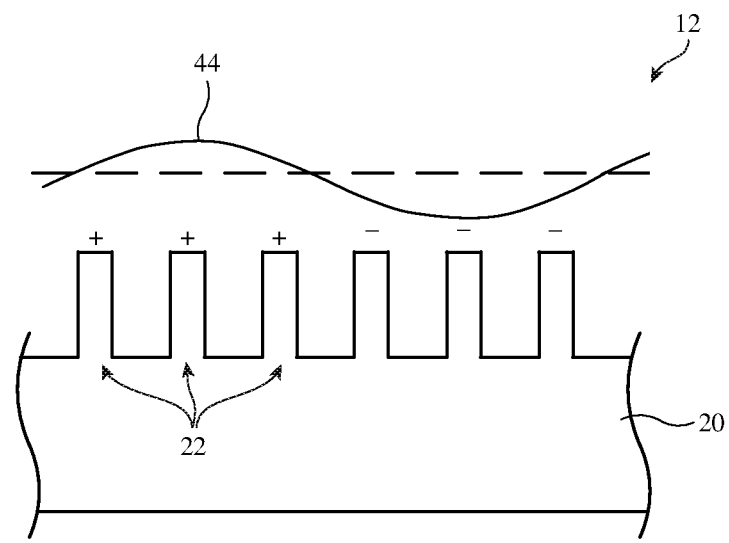
FIGS. 9A and 9B are cross-sectional side views illustrating a "+++---" stress pattern that can be applied to a linear array of fins in accordance with some embodiments.
Figure 9B:
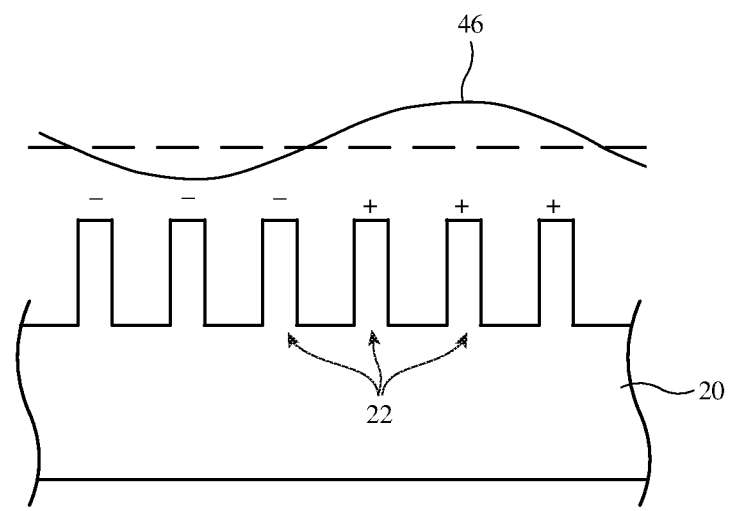

The exemplary resonator 12 having a connect-3-skip-6 configuration of FIG. 8A can be used to attain subharmonic resonance mode. FIGS. 9A and 9B are cross-sectional side views showing how pressure (e.g., volume pressure) changes over time across fins 22 of resonator 12 with the connect-3-skip-6 configuration. As shown by pressure profile 44 in FIG. 9A, groups of three adjacent fins 22 experience alternating polarities of stress caused by the acoustic waves as propagated along the gate conductor. Fins 22 subject to positive pressure may be pushed or squeezed along the fin width, whereas fins 22 subject to negative pressure may be pulled or stretched along the fin width. As a result, fins 22 within resonator 12 will have a corresponding "+++−−−+++−−−" stress pattern.

FIG. 9B shows pressure profile 46 half a cycle later when the stress inverts. Such stress pattern can yield a subharmonic resonance mode oscillating at a third of the characteristic frequency (as an example). For example, even when the fin pitch sets a resonant frequency of 54 GHz, resonator 12 having a connect-3-skip-6 configuration is operable at a subharmonic resonant frequency of 18 GHz. Operating resonator 12 at a frequency that is less than the characteristic resonant frequency can help simplify the design of circuits that receive signals from or otherwise operate in conjunction with resonator 12.

Figure 8B:
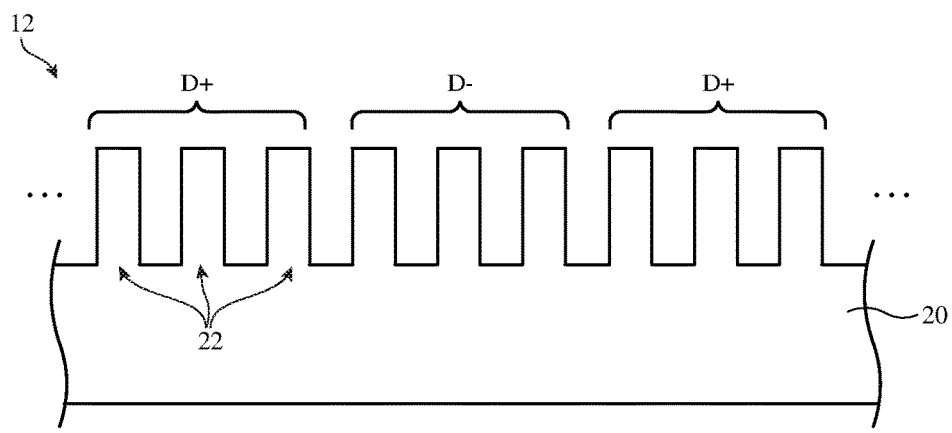
FIGS. 8B and 8C are cross-sectional side views of an illustrative FinFET-based resonator having driving cells of alternating polarity, each of which includes three fins in accordance with some embodiments.

The example of FIG. 8A in which adjacent drive cells are separated by an intervening region 42 with nondriven or floating fins is merely illustrative. FIG. 8B shows another embodiment in which alternating drive cells are immediately adjacent to one another. As shown in FIG. 8B, a negative drive cell denoted by three fins coupled to terminal D− include the only fins separating the surrounding positive drive cells, each of which includes three fins coupled to terminal D+. In other words, the spacing between the positive and negative drive cells is equal to one fin-to-fin spacing. This configuration can also be used to achieve the "+++−−−+++−−−" stress pattern shown in FIGS. 9A and 9B, thereby achieving subharmonic resonance operation.

Figure 8C:
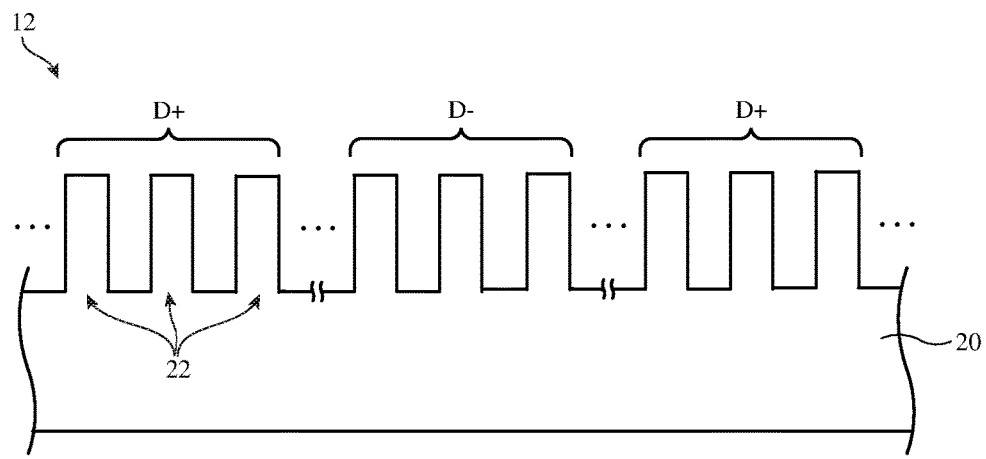

The example of FIG. 8B in which resonator 12 includes adjacent alternating drive cells separated by one fin-to-fin spacing is merely illustrative. FIG. 8C shows another embodiment in which adjacent drive cells are separated by an intervening region extending a distance that is longer than one fin-to-fin spacing. As shown in FIG. 8C, the region between adjacent alternating drive cells (e.g., drive cells having at least three adjacent drive transistors) can in general accommodate one or more intervening fins, two or more intervening fins, three or more intervening fins, four or more intervening fins, or other suitable number of intervening fins. Such intervening regions might include fully formed fins, partially formed fins, or no fins. The sense cells within resonator 12 of FIG. 8C can also be separated by an intervening region that can accommodate the same number of fins that separate adjacent drive cells.

The examples of resonator 12 in FIG. 8A-8C that can be used to achieve a "+++−−−+++−−−" stress pattern onto the array of fins are merely illustrative. If desired, resonator 12 can have a connect-4-skip-j configuration, which can be used to apply a "++++−−−−++++−−−−" stress pattern to the array of fins 22. Integer j can be equal to 8, 0 (i.e., signifying a one fin-to-fin spacing between adjacent drive cells), 1-8, 8-16, or other suitable integer value. As yet another example, resonator 12 can have a connect-5-skip-i configuration, which can be used to apply a "+++++−−−−−+++++−−−−−" stress pattern to the array of fins 22. Integer i can be equal to 10, 0 (i.e., signifying a one fin-to-fin spacing between adjacent drive cells), 1-10, 10-20, or other suitable integer value. This principal can be extended to create any desired stress pattern on an array of fins coupled to a shared gate conductor.

Figure 10A:
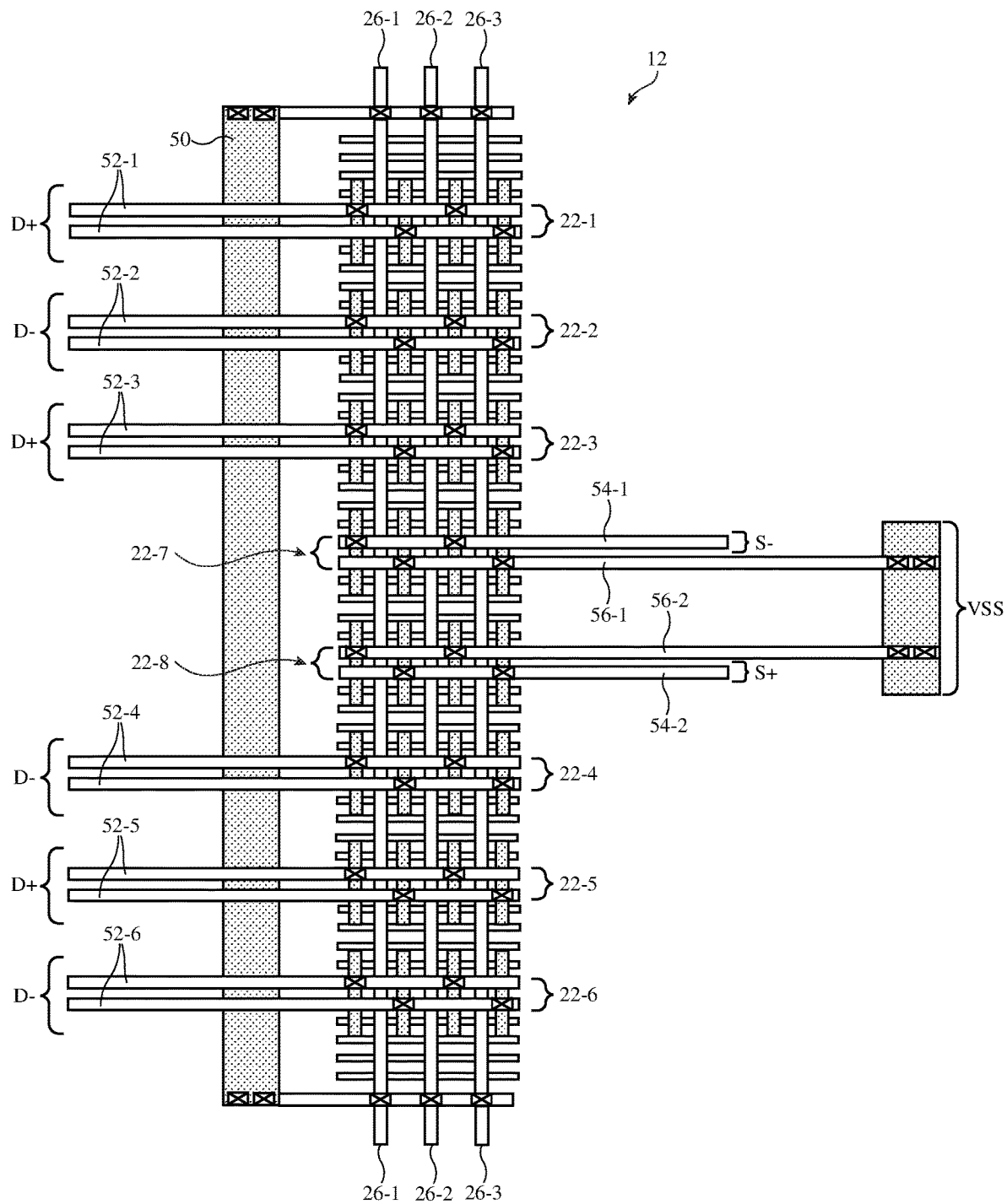
FIG. 10A is a top layout (plan) view of an illustrative FinFET-based resonator having three gate fingers, six drive cells, and two sense cells in accordance with some embodiments.

FIG. 10A is a top layout (plan) view of resonator 12 having three gate fingers, six drive cells, and two sense cells in accordance with some embodiments. As shown in FIG. 10A, resonator 12 may include an array of fifty-two fins 22 and three parallel gate conductors 26-1, 26-2, and 26-3 formed on the linear array of fins. Gate conductors 26-1, 26-2, and 26-3 extend perpendicular to the fins to form a three-finger FinFET resonator. The two ends of each of the gate conductors can be coupled together via a metal path 50 (e.g., a metal path formed in a layer-1 metal routing layer sometimes referred to as the M1 metal layer in the dielectric stack). Such gate connection and abrupt termination of the periodic fin array can cause reflections at both ends of the gate conductors, which can help provide lateral confinement of acoustic energy within the cavity region of resonator 12.

Resonator 12 may include six drive cells of alternating polarity. The first drive cell may include two drive transistors having fins 22-1 that are coupled to positive drive terminal D+ via metal paths 52-1 (e.g., metal paths forms in a layer-2 metal routing layer sometimes referred to as the M2 metal layer in the dielectric stack). The second drive cell may include two drive transistors having fins 22-2 that are coupled to negative drive terminal D− via metal paths 52-2 (e.g., M2 metal routing paths). The third drive cell may include two drive transistors having fins 22-3 that are coupled to positive drive terminal D+ via metal paths 52-3 (e.g., M2 metal routing paths).

The fourth drive cell may include two drive transistors having fins 22-4 that are coupled to negative drive terminal D− via metal paths 52-4 (e.g., M2 metal routing paths). The fifth drive cell may include two drive transistors having fins 22-5 that are coupled to positive drive terminal D+ via metal paths 52-5 (e.g., M2 metal routing paths). The sixth drive cell may include two drive transistors having fins 22-6 that are coupled to negative drive terminal D− via metal paths 52-6 (e.g., M2 metal routing paths). The first, third, and fifth drive cells coupled to the D+ drive terminal may be referred to as positive drive cells, whereas the second, fourth, and sixth drive cells coupled to the D− drive terminal may be referred to as negative drive cells. A differential AC drive signal can be applied across drive terminals D+ and D− to cause acoustic waves to travel up and down the three gate fingers.

Resonator 12 may include two sense cells interposed between two groups of drive cells. The first sense cell may include two sense transistors having a pair of fins 22-7. A first of the fins 22-7 may be coupled to negative sense terminal S− via metal path 54-1 (e.g., an M2 metal routing path), and a second of the fins 22-7 may be coupled to ground VSS via metal path 56-1 (e.g., an M2 metal routing path). The second sense cell may include two sense transistors having a pair of fins 22-8. A first of the fins 22-8 may be coupled to positive sense terminal S+ via metal path 54-2 (e.g., an M2 metal routing path), and a second of the fins 22-7 may be coupled to ground VSS via metal path 56-2 (e.g., an M2 metal routing path). The first sense cell coupled to the S− sense terminal may be referred to as a negative sense cell, whereas the second sense cell coupled to the S+ sense terminal may be referred to as a positive sense cell. Acoustic waves travelling along the gate conductors will cause current to flow through the sense transistors in the sense cells, thereby causing a corresponding output signal to be generated across the S+/S− sense terminals.

Resonator 12 of FIG. 10A has a connect-2-skip-4 configuration. The intervening region between adjacent drive and sense cells has a four-fin spacing that accommodates four fins (i.e., the intervening region may extend a distance that is equal to four times the fin width plus five times the fin-to-fin spacing). The intervening regions may include fully formed fin members, partially formed fin members, or no fins (i.e., the intervening regions may be devoid of or lack any protruding fins). The connect-2-skip-4 configuration can be used to apply a "++−−++−−" stress pattern onto the array of fifty-two fins, which enables resonator 12 to operate in a subharmonic resonance mode so that resonator is operable at a frequency that is less than the characteristic resonant frequency.

The example of FIG. 10A in which resonator 12 has three fingers, six drive cells, and two sense cells is merely illustrative. In other embodiments, resonator 12 may include only one finger, two fingers, more than three fingers, 1-3 fingers, or other suitable number of gate fingers. In some embodiments, resonator 12 may include four drive cells (e.g., two positive drive cells and two negative drive cells arranged in alternating +/−/+/− order), two to six drive cells, eight drive cells (e.g., four positive drive cells and four negative drive cells arranged in alternating +/−/+/− order), ten drive cells (e.g., five positive drive cells and five negative drive cells arranged in alternating order), or more than ten drive cells.

In some embodiments, resonator 12 may include four sense cells (e.g., two positive sense cells each having one sense fin coupled to the S+ terminal and another sense fin coupled to ground and two negative sense cells each having one sense fin coupled to the S− terminal and another sense fin coupled to ground), more than two sense cells, six sense cells (e.g., three positive sense cells each having one sense fin coupled to the S+ terminal and another sense fin coupled to ground and three negative sense cells each having one sense fin coupled to the S− terminal and another sense fin coupled to ground), or any desired number of sense cells. The sense cells may be grouped together and interposed between two groups of drive cells or may be distributed or interleaved among the various drive cells.

Figure 10B:
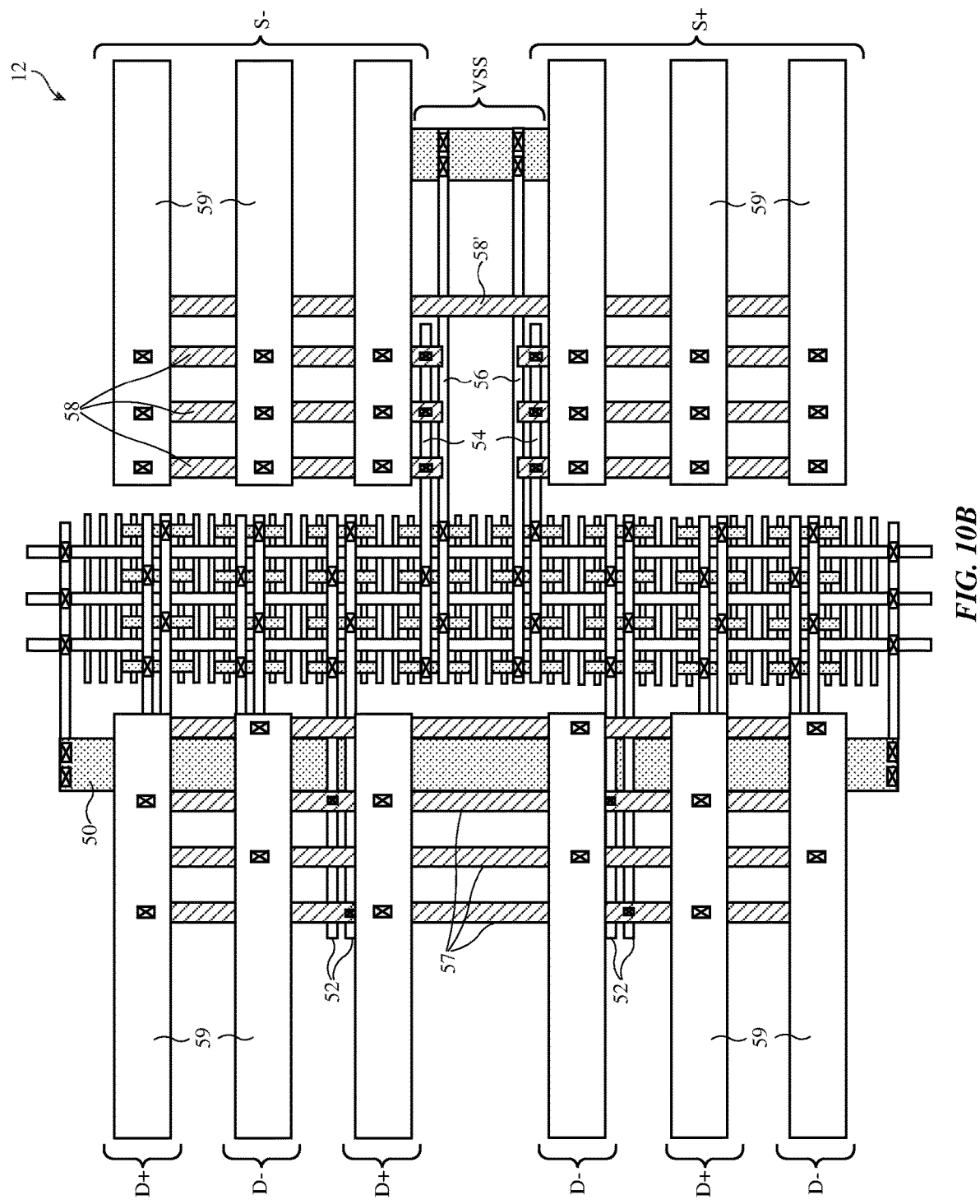
FIG. 10B is a top layout (plan) view of the resonator of FIG. 10A having a symmetric metal routing pattern in accordance with some embodiments.

FIG. 10B is a top layout (plan) view of resonator 12 of FIG. 10A having a symmetric metal routing pattern in accordance with some embodiments. As shown in FIG. 10B, the M2 metal routing paths 52 coupled to the drive cells can be coupled to metal routing paths 57 (e.g., metal paths forms in a layer-3 metal routing layer sometimes referred to as the M3 metal layer in the dielectric stack) routed parallel to the gate conductors. Metal paths 57 are coupled to metal routing paths 59 (e.g., metal paths forms in a layer-4 metal routing layer sometimes referred to as the M4 metal layer in the dielectric stack) routed parallel to paths 52. Metal paths 57 are configured to receive a differential drive signal via terminals D+ and D−.

The M2 routing paths 56 are coupled to ground VSS as described above. The M2 routing paths 54 coupled to the sense cells can be coupled to metal routing paths 58 (e.g., M3 metal routing paths) routed parallel to the gate conductors. An additional metal routing path 58' that is electrically floating may be included to help achieve layout symmetry. Metal paths 58 are coupled to metal routing paths 59' (e.g., M4 metal routing paths) routed parallel to paths 54. Metal paths 59' coupled to the negative sense cell are coupled to terminal S−, whereas metal paths 59' coupled to the positive sense cell are coupled to terminal S+. Such symmetrical layout of resonator 12 can help ensure improved differential drive and sensing operations. The particular metal routing pattern of FIGS. 10A and 10B that uses M1-M4 metal routing paths to connect to the various drive and sense nodes is also merely illustrative. If desired, other metal routing patterns or metal grid arrangements using other metal routing layers in the interconnect stack can be used.

The embodiments of FIGS. 1-10 describing a resonator 12 formed from FinFETs are merely illustrative. If desired, the present embodiments can be applied to a resonator formed from gate-all-around (GAA) field-effect transistors, sometimes referred to as nanowire FETs (see, e.g., FIG. 11). As shown in the cross-sectional side view of FIG. 11, resonator 12 may include a linear array of columns of nanowires (wires) 60 and a shared gate conductor 64 disposed over the columns of nanowires. The portion of each nanowire 60 that is wrapped around by gate conductor 64 serves as a channel region for each nanowire. Each column may include four vertically stacked nanowires 60 (as an example). In general, each column of nanowires may include any suitable number of vertically stacked nanowires. One or more gate conductors may be formed over the columns of nanowire structures (see, e.g., gate conductors of FIG. 10A).

Figure 11:
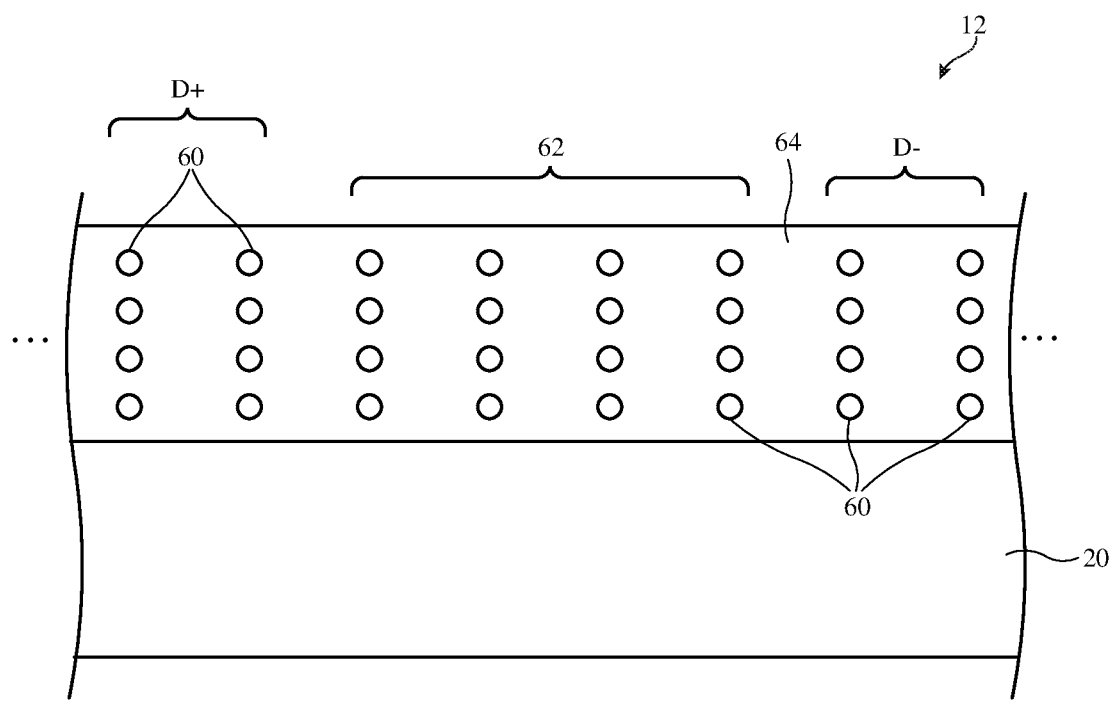
FIG. 11 is a cross-sectional side view of an illustrative nanowire FinFET-based resonator having groups of two driving nanowire columns separated by an intervening region that accommodates four nanowire columns in accordance with some embodiments.

In the example of FIG. 11, a first pair of drive transistors may include two columns of nanowires coupled to the D+ terminal to form a positive drive cell, and a second pair of drive transistors may include two columns of nanowires coupled to the D− terminal to form a negative drive cell. An intervening region 62 separating the positive drive cell and the negative drive cell may include four columns of nanowires. Resonator 12 of FIG. 11 therefore illustrates a connect-2-skip-4 configuration. If desired, intervening region 62 may include full columns of nanowires (e.g., columns having the same number of nanowires as the drive transistors), partial columns of nanowires (e.g., columns having a fewer number of nanowires than the drive transistors), or no nanowires. If desired, resonator 12 of FIG. 11 can be implemented using nanowire FETs to achieve a high Q factor, and low phase noise. Resonator 12 of FIG. 11 can be operated in a subharmonic frequency range of the resonant frequency, in a harmonic frequency range of the resonant frequency, or at the resonant frequency.

Figure 12:
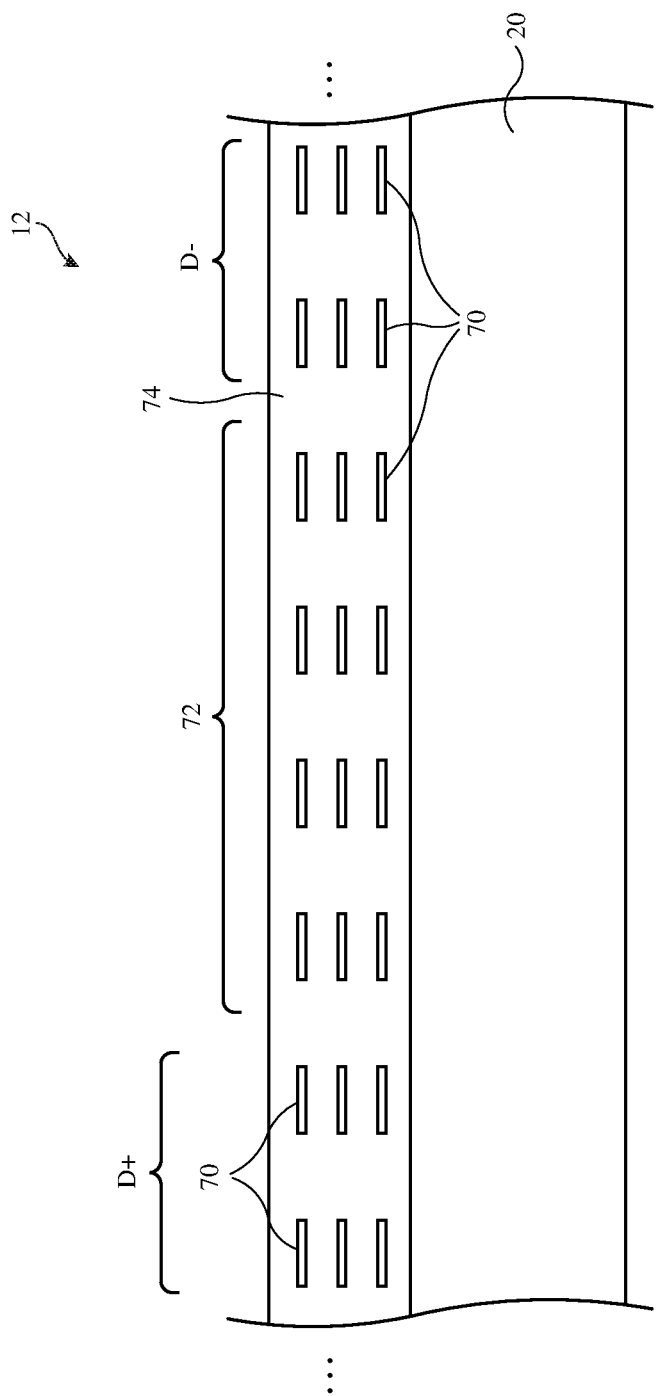
FIG. 12 is a cross-sectional side view of an illustrative nanosheet-based resonator having groups of two driving nanosheet columns separated by an intervening region that accommodates four nanosheet columns in accordance with some embodiments.

If desired, the present embodiments can also be applied to a resonator formed from nanosheet FETs (see, e.g., FIG. 12). As shown in the cross-sectional side view of FIG. 12, resonator 12 may include a linear array of columns of nanosheets (thin conductive sheets or plates) 70 and a shared gate conductor 74 disposed over the columns of nanosheets. The portion of each nanosheet 70 that is wrapped around by gate conductor 74 serves as a channel region for each nanosheet. Each column may include three vertically stacked nanosheets 70 (as an example). In general, each column of nanosheets may include any suitable number of vertically stacked nanosheets. One or more gate conductors may be formed over the columns of nanosheet structures (see, e.g., gate conductors of FIG. 10A).

In the example of FIG. 12, a first pair of drive transistors may include two columns of nanosheets coupled to the D+ terminal to form a positive drive cell, and a second pair of drive transistors may include two columns of nanosheets coupled to the D− terminal to form a negative drive cell. An intervening region 72 separating the positive and negative drive cells may accommodate four columns of nanosheets. Resonator 12 of FIG. 12 therefore illustrates a connect-2-skip-4 configuration. If desired, intervening region 72 may include full columns of nanosheets (e.g., columns having the same number of nanosheets as the drive transistors), partial columns of nanosheets (e.g., columns having a fewer number of nanosheets than the drive transistors), or no nanosheets. If desired, resonator 12 of FIG. 12 can also be implemented using nanosheet FETs to achieve a high Q factor, and low phase noise. Resonator 12 of FIG. 12 can be operated in a subharmonic frequency range of the resonant frequency, in a harmonic frequency range of the resonant frequency, or at the resonant frequency.

Many wireless communication applications rely on frequency synthesizers to generate a high-frequency signal (e.g., a radio-frequency signal in the hundreds of Megahertz or in the Gigahertz range). A conventional frequency synthesizer is typically an analog circuit that includes large inductors and capacitors, which can take up a substantial amount of valuable circuit area on an integrated circuit die. Certain wireless protocols such as cellular telephone protocols including 4G (LTE) protocols and 5G New Radio (NR) protocols impose higher demands on the spectral purity of the radio-frequency signals output using such frequency synthesizers. To improve spectral purity, the phase noise of a frequency synthesizer has to be reduced. Reduction of phase noise, however, typically comes at the cost of greater power consumption.

Figure 13:
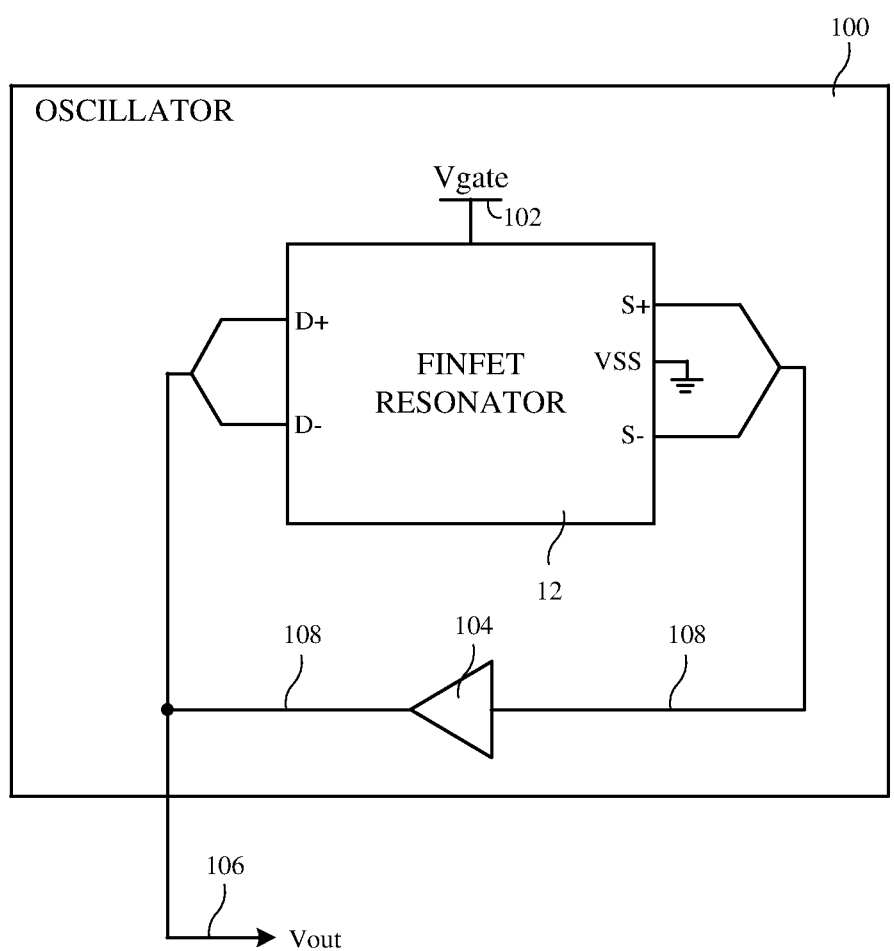
FIG. 13 is a diagram of an illustrative oscillator having a FinFET-based resonator in accordance with some embodiments.

One way of reducing phase noise is to increase the Q factor of an oscillator. In accordance with an embodiment, FIG. 13 is a diagram of an illustrative oscillator circuit such as oscillator 100 having FinFET-based resonator 12 (e.g., resonator of the type described in connection with FIGS. 1-12). As described above, resonator 12 can exhibit a high Q factor (e.g., a quality factor of at least 100, at least 1000, at least ten thousand, or at least a hundred thousand) while operating in the Gigahertz frequency range. Providing an oscillator with a resonator having such high Q factor values can help ensure better phase noise performance. Moreover, high frequency oscillators that are capable of directly outputting signals in the Gigahertz range obviates the need for frequency multipliers. Frequency multipliers can oftentimes introduce additional phase noise, so eliminating the need of frequency multiplication at the output of an oscillator can help further improve phase noise performance.

As shown in FIG. 13, oscillator 100 includes FinFET resonator 12 configured to output a radio-frequency signal Vout at an oscillator output port 106. Resonator 12 may have drive terminals D+ and D−, sense terminals S+ and S−, and associated voltage biasing terminals. In particular, the one or more gate conductors within resonator 12 may be configured to receive gate biasing voltage Vgate at voltage bias terminal 102, whereas the VSS connection at the sense cells can be shorted to ground. Voltage Vgate may be set equal to 0.7, 0.8 V, 0.9 V, 1 V, greater than 1 V, less than 0.8 V, 0.5-1 V, or other suitable DC voltage level. Voltage Vgate may be a static (fixed) bias voltage or may be a dynamically adjustable voltage.

Resonator 12 may be connected in a feedback loop. For example, the sense terminals of resonator 12 may be coupled to the drive terminals via a feedback path 108. A buffer circuit such as buffer 104 can optionally be interposed between the sense and drive terminals in feedback path 108. Buffer 104 may be an amplifier. In the example of FIG. 13, the oscillator output port 106 is coupled to the drive terminals. This is merely illustrative. If desired, oscillator output port 106 can instead be coupled to the sense terminals. Since resonator 12 does not include any large inductors or capacitors that is typically required in an LC tank, the area of oscillator 100 is relatively small. The small number of components within oscillator 100 can also help minimize phase noise and power consumption.

Figure 14:
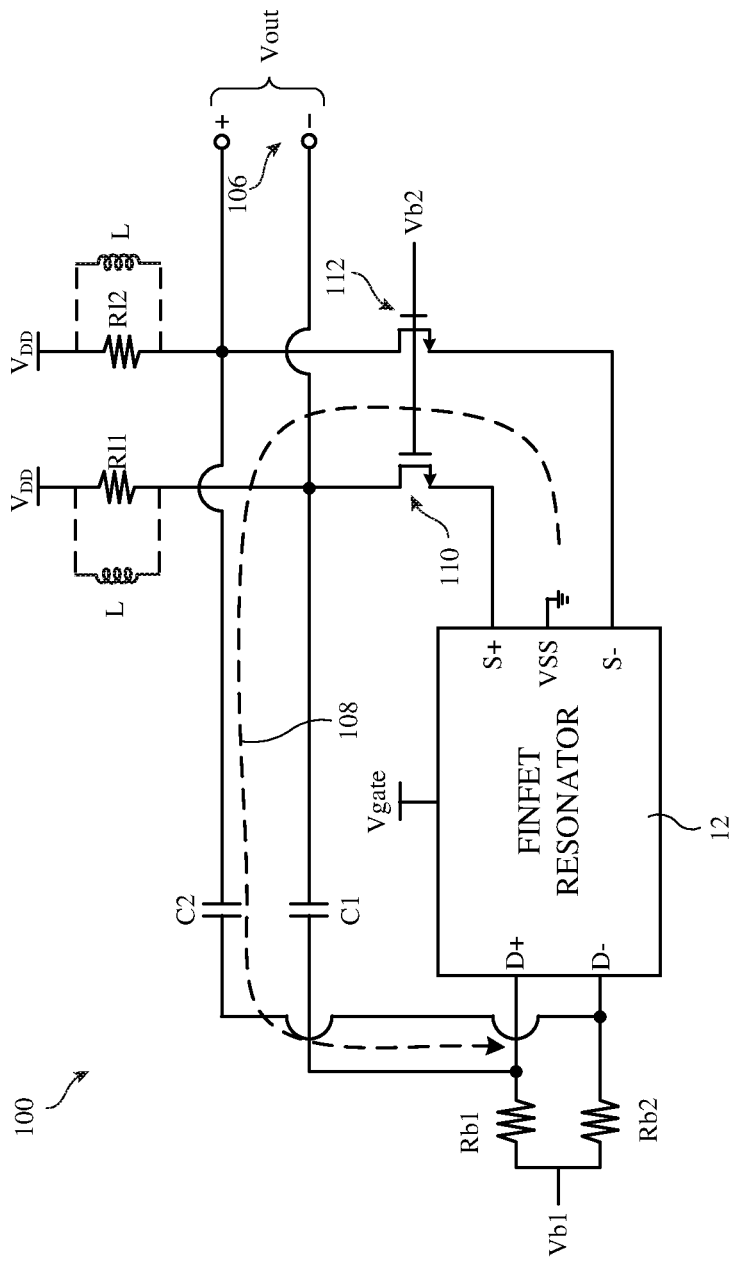
FIG. 14 is a circuit diagram showing one suitable implementation of the oscillator shown in FIG. 13 in accordance with some embodiments.

FIG. 14 is a circuit diagram showing one suitable implementation of oscillator 100. As shown in FIG. 14, oscillator 100 may include resonator 12 (e.g., resonator 12 described in connection with FIGS. 1-12), biasing resistors Rb1 and Rb2, load resistors Rl1 and Rl2, capacitors C1 and C2, and transistors 110 and 112. The positive drive terminal D+ of resonator 12 may be coupled to a first bias voltage Vb1 via first biasing resistor Rb1, whereas the negative drive terminal D− of resonator 12 may be coupled to first bias voltage Vb1 via second biasing resistor Rb2. Bias voltage Vb1 may be equal to 40 mV, 30-50 mV, 20-60 mV, less than 40 mV, greater than 40 mV, less than 100 mV, less than 200 mV, less than 300 mV, or other suitable bias voltage level.

Transistors 110 and 112 can also be FinFET transistors (e.g., n-type FinFET transistors) formed on the same substrate as resonator 12. Transistor 110 may have a source terminal coupled to the positive sense terminal S+ of resonator 12, a drain terminal coupled to positive power supply voltage VDD via first load resistor Rl1, and a gate terminal configured to receive a second bias voltage Vb2. Transistor 112 may have a source terminal coupled to the negative sense terminal S− of resonator 12, a drain terminal coupled to positive power supply voltage VDD via second load resistor Rl2, and a gate terminal configured to receive the second bias voltage Vb2. The source and drain terminals of transistors 110 and 112 can sometimes be referred to as first and second "source-drain" terminals, respectively. Bias voltage Vb2 may be equal to 200 mV, 100-300 mV, 50-400 mV, less than 200 mV, greater than 200 mV, greater than 300 mV, greater than 400 mV, or other suitable bias voltage level. Bias voltage Vb2 may be greater than Vb1, equal to Vb1, or less than Vb1.

Capacitor C1 may have a first terminal coupled to the D+ terminal of resonator 12 and a second terminal coupled to the drain terminal of transistor 110. Capacitor C2 may have a first terminal coupled to the D− terminal of resonator 12 and a second terminal coupled to the drain terminal of transistor 112. Connected in this way, capacitors C1 and C2 are configured to decouple the DC potential of the sense terminals from the drive terminals and are therefore sometimes referred to as DC-decoupling capacitors. However, high-frequency alternating-current (AC) signals can be coupled from the sense terminals back to the drive terminals via capacitors C1 and C2, which can also sometimes be referred to as AC-coupling capacitors.

The feedback path 108 of oscillator 110 is formed using capacitors C1 and C2 and transistors 110 and 112. Transistors 110 and 112 may serve as a common-gate cascode amplifier stage. A "common-gate" amplifier stage can be defined as an amplifier stage with an amplifying transistor having its gate terminal coupled to a common (fixed) voltage source (e.g., Vb2). Transistors 110 and 112 also serve as a cascode stage to the sense transistors within resonator 12. Transistors 110 and 112 (sometimes referred to collectively as a cascode amplifier) can be configured to transform the output current at the sense terminals to voltage signal Vout at output 106. Output port 106 may be a differential output port. The example of FIG. 14 in which the output port 106 is at the output of the cascode amplifier is merely illustrative (e.g., output port 106 is AC-coupled to the drive terminals) If desired, output port 106 can alternatively be at the input of the cascode amplifier (e.g., output port 106 can be located at the source terminals of transistors 110 and 112 and shorted to the sense terminals).

The load resistors Rl1 and Rl2 and the sizing of transistors 110 and 112 set the bias point for the sense cells within resonator 12. If desired, load resistors Rl1 and Rl2 can be implemented as programmable switches or other adjustable resistive component to help attain a loop gain of one or to otherwise ensure oscillation. The drain terminals of cascode transistors 110 and 112, capacitors C1 and C2, and the input capacitance associated with the drive cells can collectively sum up to a large total capacitance at oscillator output 106. If care is not taken, this large parasitic capacitance can short out the load resistors Rl1 and Rl2 or provide an excessive amount of phase shift. To prevent this, optional load inductors L can be coupled in parallel with the load resistors to create a parallel LC tank with the parasitic capacitance. The inductance of inductors L can be chosen to provide the proper amount of output impedance to achieve the desired oscillation condition. Inductors L can also be used to reduce a voltage headroom requirement at the oscillator output and can help reduce spurious modes. If the parasitic capacitance is too small, additional capacitors can be coupled to oscillator output 106 to help set the resonant frequency of the LC tank.

The exemplary oscillator 100 of FIG. 14 is merely illustrative. Configured and operated in this way, oscillator 100 can generate an oscillator output signal in the Gigahertz range (e.g., greater than 1 GHz, greater than 10 GHz, 10-50 GHz, or greater than 50 GHz) while maintaining a high Q (and therefore low phase noise) and while minimizing power consumption and area overhead. If desired, more or less components can be inserted in feedback path 108. If desired, other types of amplifiers or buffers can be inserted in feedback path 108. Other types of loading circuits can be coupled at the output port 106 of oscillator 100. Other types of biasing schemes can be used to bias the drive, sense, and gate terminals of resonator 12.

Figure 15:
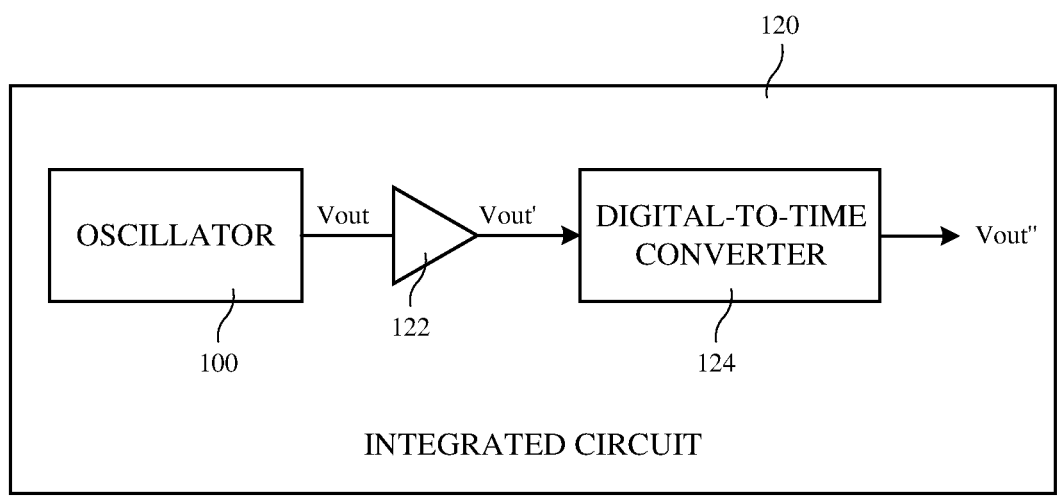
FIG. 15 is a diagram of an integrated circuit having an oscillator configured to generate output signals to a digital-to-time converter in accordance with some embodiments.

Oscillator 100 implemented using FinFET-based resonator 12 can generate an oscillator output signal Vout having a frequency that is greater than 10 GHz. In certain applications, it may be desirable to scale the oscillator frequency down to a lower frequency range. FIG. 15 is a diagram of an integrated circuit 120 that includes oscillator 100, a digital-to-time converting circuit such as digital-to-time converter 124, and an optional buffer stage interposed between oscillator 100 and digital-to-time converter 124. As shown in FIG. 15, buffer 122 may receive signal Vout from oscillator 100 and output a corresponding signal Vout' to digital-to-time converter 124. In response, digital-to-time converter 124 can generate signal Vout" at its output.

Digital-to-time converter 124 can be configured as an adjustable phase shifting circuit, which is configured to divide Vout' by some value x to generate Vout" at a lower frequency. Value x can be an integer value or a fractional value. In one suitable arrangement, digital-to-time converter 124 may include an ultracourse stage implemented as a multi-modulus divider, a coarse delay stage, and a fine interpolation stage. In general, signal Vout" may have a frequency that is lower than the frequency of signal Vout. As examples, signal Vout" may be less than half of the frequency of Vout, less than a third of the frequency of Vout, less than a quarter of the frequency of Vout, or some other fraction of the frequency of Vout. This example is merely illustrative. If desired, oscillator 100 may feed oscillator output signal Vout to more than one phase shifting circuit to generate multiple oscillator signals at different frequencies. If desired, oscillator 100 may feed oscillator output signal Vout to a circuit that increases or multiplies the frequency of Vout by an integer y to further boost the frequency of Vout.

Figure 16:
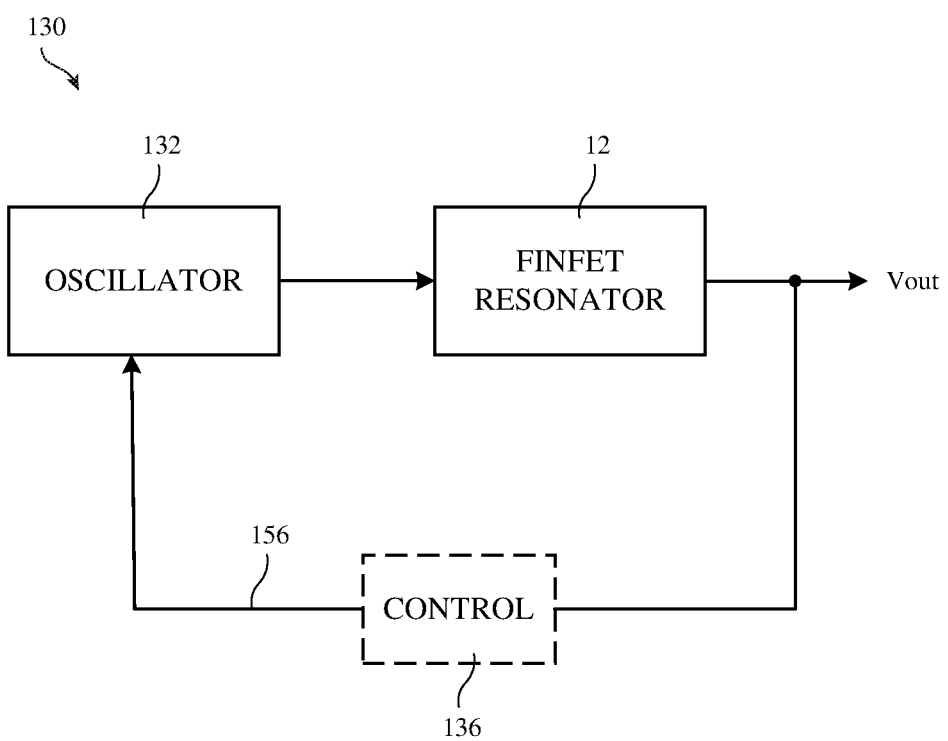
FIG. 16 is a diagram of oscillator circuitry having an oscillator stage and a FinFET-based resonator filter stage in accordance with some embodiments.

The examples of FIGS. 13 and 14 in which oscillator 100 has a resonator 12 with sense terminals feeding back to its drive terminals is merely illustrative. FIG. 16 illustrates another suitable embodiment of oscillator circuitry 130 having an oscillator circuit 132 coupled to a resonator 12 (see, e.g., the FinFET-based resonator described in connection with FIGS. 1-12). Arranged in this way, oscillator 132 operates as a first stage that generates an oscillator signal, whereas resonator 12 operates as a second stage that filters the oscillator signal output from oscillator 132. A final filtered oscillator output signal Vout is provided at the output of resonator 12.

The final output voltage Vout may be fed back to the oscillator stage via a feedback path such as feedback path 156. An optional control circuit such as controller 136 may be inserted in feedback path 156. Controller 136 may be configured to dynamically tune one or more components within oscillator 132 to ensure that output voltage Vout is oscillating at the desired frequency. As examples, controller 136 may detect a voltage level at the Vout port, a current level at the Vout port, a power level at the Vout port, or an energy level at the Vout port and in response, adjust a capacitor within oscillator 132, an inductor within oscillator 132, a resistor within oscillator 132, a transistor within oscillator 132, or make other suitable adjustments to oscillator 132.

Figure 17:
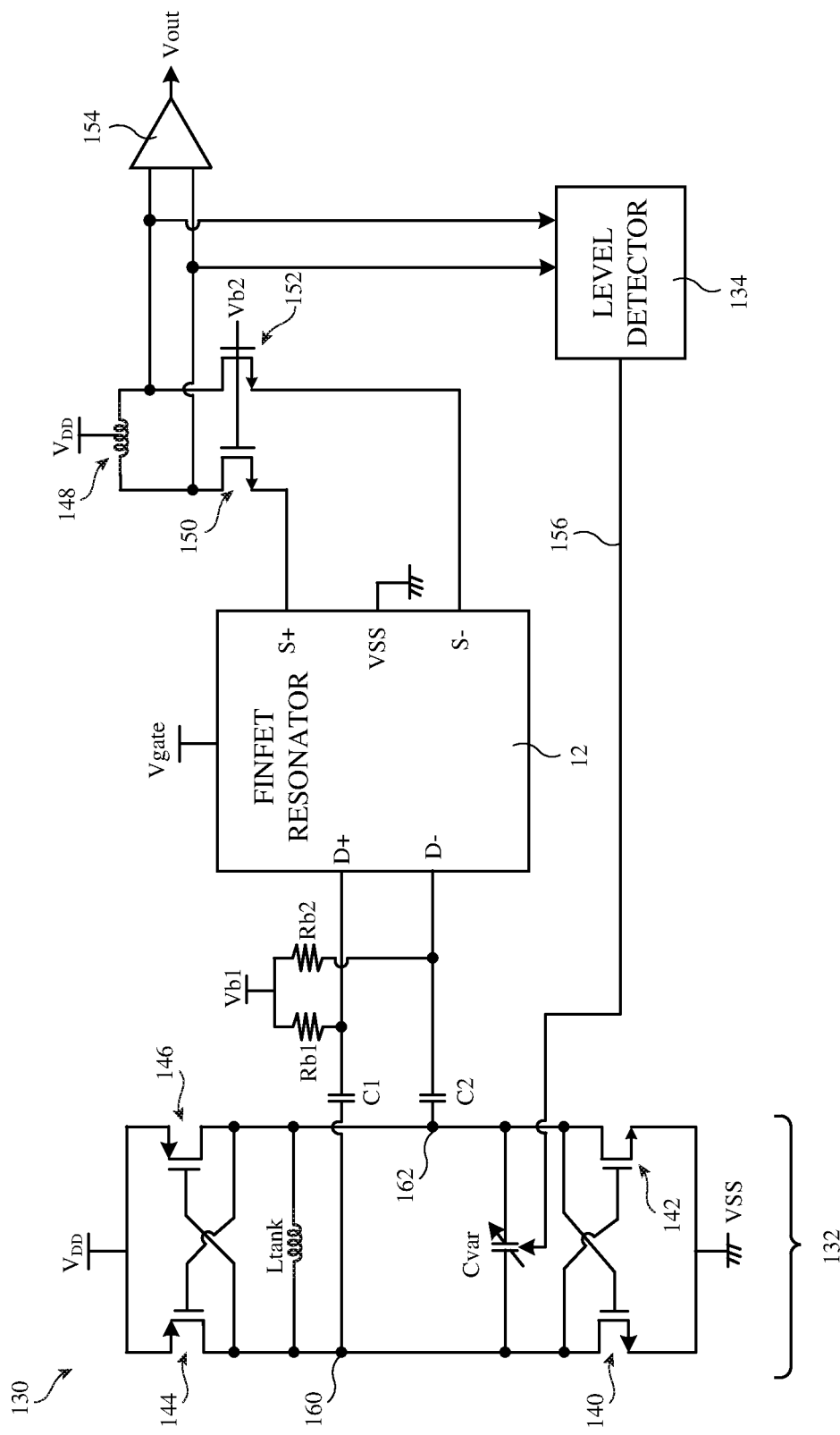
FIG. 17 is circuit diagram showing one suitable implementation of the oscillator circuitry shown in FIG. 16 in accordance with some embodiments.

FIG. 17 is a circuit diagram showing one suitable implementation of oscillator circuitry 130 of the type shown in FIG. 16. As shown in FIG. 17, oscillator 132 may be implemented as an LC (inductor and capacitor based) oscillator 132 that is coupled to a resonator 12 configured as a filter stage. Oscillator 132 may include transistors 140, 142, 144, and 146 (e.g., FinFETs formed in the same substrate as resonator 12), an inductor Ltank, and a variable capacitor Cvar.

Transistor 140 may be an n-type FinFET having a drain terminal coupled to node 160, a source terminal coupled to ground VSS, and a gate terminal coupled to the drain terminal of transistor 142. Transistor 142 may be an n-type FinFET having a drain terminal coupled to node 162, a source terminal coupled to ground VSS, and a gate terminal coupled to the drain terminal of transistor 140. Connected in this way, transistors 140 and 142 are referred to as being cross-coupled with one another.

Transistor 144 may be a p-type FinFET having a drain terminal coupled to node 160, a source terminal coupled to positive power supply VDD, and a gate terminal coupled to the drain terminal of transistor 146. Transistor 146 may be a p-type FinFET having a drain terminal coupled to node 162, a source terminal coupled to power supply VDD, and a gate terminal coupled to the drain terminal of transistor 144. Connected in this way, transistors 144 and 146 can be referred to as being cross-coupled with one another.

Inductor Ltank (sometimes referred to as the tank inductor) may have a first terminal coupled to node 160 and a second terminal coupled to node 162. Capacitor Cvar (sometimes referred to as the tank capacitor) may have a first terminal coupled to node 160 and a second terminal coupled to node 162. Nodes 160 and 162 are output nodes of LC oscillator 132. LC oscillator 132 configured in this way may exhibit a relatively low quality factor (e.g., a Q factor of 10-25) and may sometimes be referred to as a low-Q oscillator.

Resonator 12 may be coupled to the output of LC oscillator 132 to serve as an output filter stage. The gate conductor(s) within resonator 12 may be configured to receive gate biasing voltage Vgate, whereas the VSS connection at the sense cells can be shorted to ground. Voltage Vgate may be set equal to 0.7, 0.8 V, 0.9 V, 1 V, greater than 1 V, less than 0.8 V, 0.5-1 V, or other suitable DC voltage level. Voltage Vgate may be a static bias voltage or may be a dynamically adjustable voltage.

The positive drive terminal D+ of resonator 12 may be coupled to oscillator output node 160 via first capacitor C1, whereas the negative drive terminal D− of resonator 12 may be coupled to oscillator output node 162 via second capacitor C2. Capacitors C1 and C2 are configured as AC-coupling capacitors. The positive drive terminal D+ of resonator 12 may also be coupled to a first bias voltage Vb1 via first biasing resistor Rb1, whereas the negative drive terminal D− of resonator 12 may be coupled to first bias voltage Vb1 via second biasing resistor Rb2. Bias voltage Vb1 may be equal to 40 mV, 30-50 mV, 20-60 mV, less than 40 mV, greater than 40 mV, less than 100 mV, less than 200 mV, less than 300 mV, or other suitable bias voltage level. Configured in this way, resonator 12 serves as an output filter for oscillator 132 and can help increase the overall Q factor of oscillator circuitry 130 to be greater than the relatively low Q factor of LC oscillator 132. For example, using resonator 12 to filter the output of LC oscillator 132 can help increase the overall Q factor of circuitry 130 by at least 2×, 4×, 10×, 2-10×, 100×, 10-100×, or more.

Oscillator circuitry 130 may further include transistors 150 and 152 (e.g., n-type FinFETs) formed on the same substrate as resonator 12. Transistor 150 may have a source terminal coupled to the positive sense terminal S+ of resonator 12, a drain terminal coupled to a first terminal of a load inductor 148, and a gate terminal configured to receive a second bias voltage Vb2. Transistor 152 may have a source terminal coupled to the negative sense terminal S− of resonator 12, a drain terminal coupled to a second terminal of load inductor 148, and a gate terminal configured to receive the second bias voltage Vb2. Inductor 148 may have a center-tap terminal coupled to positive power supply voltage VDD. The source and drain terminals of transistors 150 and 152 can sometimes be referred to as first and second "source-drain" terminals, respectively. Bias voltage Vb2 may be equal to 200 mV, 100-300 mV, 50-400 mV, less than 200 mV, greater than 200 mV, greater than 300 mV, greater than 400 mV, or other suitable bias voltage level. Bias voltage Vb2 may be greater than Vb1, equal to Vb1, or less than Vb1.

Oscillator circuitry 130 may include an output buffer stage 154 having a first input coupled to the drain terminal of transistor 150, a second input terminal coupled to the drain terminal of transistor 152, and an output at which oscillator output signal Vout is generated. Oscillator circuitry 130 may further include a level detection circuit such as level detector 134. Level detector 134 may be a voltage level detector, a current level detector, a power level detector, or an energy level detector. Level detector 134 may be configured to tune oscillatory circuitry 130 according to the characteristic resonant frequency of resonator 12. For example, if output signal Vout is toggling at the resonant frequency of resonator 12, then the highest signal amplitude can be detected using level detector 134. Thus, if the frequency of either resonator 12 or LC oscillator 132 starts to drift, then the level detector 134 will in response tune variable capacitor Cvar according to the gradient of the drift in signal amplitude. In other words, level detector 134 forms a feedback loop to tune the low-Q oscillator 132. This feedback control path 156 can help ensure a stable output signal Vout at the resonant frequency of resonator 12.

Using FinFET-based resonator 12 as an output filter stage for the LC oscillator 132 can help separate the filter function from oscillator 132, which offers a higher degree of freedom for biasing resonator 12 while allowing for additional flexibility in the design of resonator 12. The example of FIG. 17 in which the first oscillator stage 132 is an LC (low-Q oscillator) is merely illustrative. If desired, other types of oscillator circuits exhibiting higher Q factors, other acoustic-wave based resonators, ring oscillators, or other noise source(s) can be implemented as the first stage. If desired, multiple resonator-based filter stages can be inserted at the output of the first oscillator stage.

The foregoing is merely illustrative and various modifications can be made to the described embodiments. The foregoing embodiments may be implemented individually or in any combination.

What is claimed is:

1. An oscillator comprising:
a resonator having:
drive terminals coupled to an oscillator output port;
sense terminals coupled to the drive terminals via a feedback path;
a substrate having a linear array of protruding fins characterized by a fin pitch that determines a resonant frequency of the resonator; and
a gate conductor formed on the linear array of protruding fins and configured to:
extend in a direction perpendicular to each fin in the linear array of protruding fins;
form drive cells with respective groups of adjacent fins in the linear array of protruding fins such that the drive cells receive drive signals from the drive terminals to generate acoustic waves that travel along the linear array of protruding fins, wherein the acoustic waves pulse at a frequency that is in a subharmonic frequency range of the resonant frequency; and
form sense cells with respective groups of adjacent fins in the linear array of protruding fins such that the sense cells are coupled to the sense terminals.

2. The oscillator of claim 1, further comprising:
an amplifier having an input coupled to the sense terminals and having an output coupled to the drive terminals.

3. The oscillator of claim 1, wherein the gate conductor is configured to receive a fixed gate bias voltage.

4. The oscillator of claim 3, further comprising:
a first resistor having a first terminal coupled to a first of the drive terminals and having a second terminal configured to receive a first bias voltage; and
a second resistor having a first terminal coupled to a second of the drive terminals and having a second terminal configured to receive the first bias voltage.

5. The oscillator of claim 4, further comprising:
a first transistor having a first source-drain terminal coupled to a first of the sense terminals, a second source-drain terminal coupled to the oscillator output port, and a gate terminal configured to receive a second bias voltage; and
a second transistor having a first source-drain terminal coupled to a second of the sense terminals, a second source-drain terminal coupled to the oscillator output port, and a gate terminal configured to receive the second bias voltage.

6. The oscillator of claim 5, further comprising:
a first capacitor having a first terminal coupled to the first of the drive terminals and having a second terminal coupled to the second source-drain terminal of the first transistor; and
a second capacitor having a first terminal coupled to the second of the drive terminals and having a second terminal coupled to the second source-drain terminal of the second transistor.

7. The oscillator of claim 6, further comprising:
a first load circuit having a first terminal coupled to the second source-drain terminal of the first transistor and having a second terminal coupled to a positive power supply line; and
a second load circuit having a first terminal coupled to the second source-drain terminal of the second transistor and having a second terminal coupled to the positive power supply line.

8. The oscillator of claim 7, further comprising:
a first inductor coupled in parallel with the first load circuit; and
a second inductor coupled in parallel with the second load circuit.

9. The oscillator or claim 7, wherein the first and second load circuits comprise loads selected from the group consisting of: resistors and programmable switches.

10. The oscillator of claim 1, wherein:
the linear array of protruding fins is characterized by a fin width;
a first of the drive cells comprises a first group of three adjacent fins in the linear array of protruding fins and is coupled to a positive drive terminal of the drive terminals;
a second of the drive cells comprises a second group of three adjacent fins in the linear array of protruding fins and is coupled to a negative drive terminal of the drive terminals;

the adjacent fins in the first of the drive cells are separated by a fin-to-fin spacing equal to the fin pitch minus the fin width;

the first of the drive cells and the second of the drive cells are separated by an intervening region that extends a distance equal to four times the fin width plus five times the fin-to-fin spacing;

a first of the sense cells comprises a first group of three adjacent fins in the linear array of protruding fins and is coupled to a positive sense terminal of the sense terminals and to a ground terminal;

a second of the sense cells comprises a second group of three adjacent fins in the linear array of protruding fins and is coupled to a negative sense terminal of the sense terminals and to the ground terminal;

the adjacent fins in the first of the sense cells are separated by the fin-to-fin spacing; and the first of the sense cells and the second of the sense cells are separated by an intervening region that extends a distance equal to four times the fin width plus five times the fin-to-fin spacing.

11. An oscillator comprising:
a resonator having:
drive terminals coupled to an oscillator output port;
sense terminals coupled to the drive terminals via a feedback path;
a substrate having a linear array of protruding fins characterized by a fin pitch that determines a resonant frequency of the resonator; and
a gate conductor formed on the linear array of protruding fins and configured to:
extend in a direction perpendicular to each fin in the linear array of protruding fins;
form drive cells with respective groups of adjacent fins in the linear array of protruding fins such that the drive cells receive drive signals from the drive terminals to generate acoustic waves that travel along the linear array of protruding fins; and
form sense cells with respective groups of adjacent fins in the linear array of protruding fins such that the sense cells are coupled to the sense terminals,
wherein:
the linear array of protruding fins is characterized by a fin width;
a first of the drive cells comprises a pair of adjacent fins in the linear array of protruding fins and is coupled to a positive drive terminal of the drive terminals;
a second of the drive cells comprises a pair of adjacent fins in the linear array of protruding fins and is coupled to a negative drive terminal of the drive terminals;
the pair of adjacent fins in the first of the drive cells are separated by a fin-to-fin spacing equal to the fin pitch minus the fin width;
the first of the drive cells and the second of the drive cells are separated by an intervening region that extends a distance equal to four times the fin width plus five times the fin-to-fin spacing;
a first of the sense cells comprises a pair of adjacent fins in the linear array of protruding fins and is coupled to a positive sense terminal of the sense terminals and to a ground terminal;
a second of the sense cells comprises a pair of adjacent fins in the linear array of protruding fins and is coupled to a negative sense terminal of the sense terminals and to the ground terminal;
the pair of adjacent fins in the first of the sense cells are separated by the fin-to-fin spacing; and
the first of the sense cells and the second of the sense cells are separated by an intervening region that extends a distance equal to four times the fin width plus five times the fin-to-fin spacing.

12. The oscillator of claim 11, wherein the intervening region includes four fully formed fins in the linear array of protruding fins.

13. The oscillator of claim 11, wherein the intervening region includes four partially formed fins in the linear array of protruding fins.

14. The oscillator of claim 11, wherein the intervening region is devoid of fins.

15. An oscillator, comprising:
a resonator having drive terminals, sense terminals, and fin field-effect transistor (FinFET) circuitry coupled to the drive and sense terminals;
a first amplifying transistor having a first source-drain terminal coupled to a first of the sense terminals, a second source-drain terminal coupled to a first of the drive terminals, and a gate terminal configured to receive a bias voltage; and
a second amplifying transistor having a first source-drain terminal coupled to a second of the sense terminals, a second source-drain terminal coupled to a second of the drive terminals, and a gate terminal configured to receive the bias voltage.

16. The oscillator of claim 15, wherein the fin field-effect transistor (FinFET) circuitry comprises:
a substrate having a linear array of protruding fins characterized by a fin pitch that determines a resonant frequency of the resonator; and
a gate conductor formed on the linear array of protruding fins and configured to:
form drive cells with respective groups of adjacent fins in the linear array of protruding fins such that the drive cells receive drive signals from the drive terminals to generate acoustic waves that travel along the linear array of protruding fins; and
form sense cells with respective groups of adjacent fins in the linear array of protruding fins such that the sense cells are coupled to the sense terminals.

17. The oscillator of claim 16, wherein the acoustic waves pulse at a frequency that is in a subharmonic frequency range of the resonant frequency.

18. The oscillator of claim 16, wherein the acoustic waves pulse at a frequency that is in a harmonic frequency range of the resonant frequency or is equal to the resonant frequency.

19. The oscillator of claim 15, further comprising:
a first capacitor coupled between the second source-drain terminal of the first transistor and a first of the drive terminals; and
a second capacitor coupled between the second source-drain terminal of the second transistor and a second of the drive terminals.

* * * * *

UNITED STATES PATENT AND TRADEMARK OFFICE
CERTIFICATE OF CORRECTION

| | |
|---|---|
| PATENT NO. | : 11,323,070 B1 |
| APPLICATION NO. | : 17/233137 |
| DATED | : May 3, 2022 |
| INVENTOR(S) | : Harald Pretl, Ehrentraud Hager and Aly Ismail |

It is certified that error appears in the above-identified patent and that said Letters Patent is hereby corrected as shown below:

In the Claims

Column 20, Line 54, Claim 9 "or claim 7" should read -- of claim 7 --

Signed and Sealed this
Twenty-fifth Day of October, 2022

*Katherine Kelly Vidal*

Katherine Kelly Vidal
*Director of the United States Patent and Trademark Office*